US012712049B2

(12) United States Patent
Mei et al.

(10) Patent No.: US 12,712,049 B2
(45) Date of Patent: Aug. 18, 2026

(54) MEMORY DEVICES USING DEFECTIVE ADDRESS INFORMATION PROCESSING CIRCUITS, AND OPERATING METHODS, AND MEMORY SYSTEMS THEREOF

(71) Applicant: YANGTZE MEMORY TECHNOLOGIES CO., LTD., Wuhan (CN)

(72) Inventors: Xiaodong Mei, Wuhan (CN); Daesik Song, Wuhan (CN); Zhefan Li, Wuhan (CN); Huangpeng Zhang, Wuhan (CN); Jinze Song, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 241 days.

(21) Appl. No.: 18/543,552

(22) Filed: Dec. 18, 2023

(65) Prior Publication Data

US 2025/0174296 A1 May 29, 2025

(30) Foreign Application Priority Data

Nov. 28, 2023 (CN) ......................... 202311614274.5

(51) Int. Cl.
*G11C 7/10* (2006.01)
*G11C 29/00* (2006.01)

(52) U.S. Cl.
CPC ............ *G11C 29/76* (2013.01); *G11C 7/1039* (2013.01); *G11C 29/785* (2013.01)

(58) Field of Classification Search
CPC ... G11C 29/76; G11C 29/785; G11C 29/4401; G11C 7/1039; G11C 2029/4402; G11C 16/08
See application file for complete search history.

(56) References Cited

U.S. PATENT DOCUMENTS 7,234,120 B1 * 6/2007 Staab ............ G01R 31/318342 716/136
2014/0157045 A1 * 6/2014 Kim ....................... G11C 29/76 714/6.13
2024/0055070 A1 * 2/2024 Shen ...................... G11C 29/72

* cited by examiner

*Primary Examiner* — Sultana Begum
(74) *Attorney, Agent, or Firm* — BAYES PLLC

(57) ABSTRACT

A memory device includes a first defective address information memory configured to store multiple pieces of initial defective address information, the multiple pieces of initial defective address information include initial target defective address information and multiple pieces of initial non-target defective address information; a defective address information processing circuit connected to the first defective address information memory and configured to compare the initial target defective address information with each of the multiple pieces of initial non-target defective address information, determine whether to process the initial non-target defective address information based on a comparison result, and output multiple pieces of defective address information corresponding to the multiple pieces of the initial defective address information; and a second defective address information memory connected to the defective address information processing circuit and configured to store the multiple pieces of defective address information.

20 Claims, 17 Drawing Sheets

MEMORY DEVICES USING DEFECTIVE ADDRESS INFORMATION PROCESSING CIRCUITS, AND OPERATING METHODS, AND MEMORY SYSTEMS THEREOF

CROSS-REFERENCE TO RELATED APPLICATIONS

The present application claims the benefit of priority to Chinese Application No. 202311614274. 5, filed on Nov. 28, 2023, the content of which is incorporated herein by reference in its entirety.

TECHNICAL FIELD

The implementations of the present disclosure relate to semiconductor technology, relating to but not limited to, a memory device and an operating method thereof, a memory system and a computer readable storage medium.

BACKGROUND

Memory device is an indispensable part of modern electronic devices. The memory devices may not only improve the storage capacity of devices, but also make the electronic devices to be more intelligent. How to improve the performance of memory devices has become an urgent problem to be solved.

SUMMARY

According to one aspect of the present disclosure, a memory device is provided. The memory device may include a first defective address information memory. The first defective address information memory may be configured to store multiple pieces of initial defective address information, and the multiple pieces of initial defective address information may include initial target defective address information and multiple pieces of initial non-target defective address information. The memory device may include a defective address information processing circuit. The defective address information processing circuit may be connected to the first defective address information memory. The defective address information processing circuit may be configured to compare the initial target defective address information with each of the multiple pieces of initial non-target defective address information, determine whether to process the initial non-target defective address information based on a comparison result, and output multiple pieces of defective address information corresponding to the multiple pieces of the initial defective address information. The memory device may include a second defective address information memory. The second defective address information memory may be connected to the defective address information processing circuit, and may be configured to store the multiple pieces of defective address information.

In some implementations, each of the multiple pieces of initial defective address information may include at least a first identification information, the first identification information may indicate whether the corresponding initial defective address information comprises a defective address and a redundant address corresponding to the defective address. In some implementations, each of the multiple pieces of defective address information may include a defective address, a second identification information, and a redundant address corresponding to the defective address. In some implementations, the second identification information may indicate whether a corresponding relationship between the defective address and the redundant address is valid.

In some implementations, the defective address information processing circuit may be configured to determine whether the defective address in the initial target defective address information is the same as the defective address in the initial non-target defective address information. In some implementations, the defective address information processing circuit may be configured to, in response to the defective address in the initial target defective address information being different from the defective address in the initial non-target defective address information, configure a second identification information as a first value for the corresponding defective address information. In some implementations, the first value included in the second identification information may indicate that the corresponding relationship between the defective address and the redundant address in the corresponding defective address information is valid. In some implementations, the defective address information processing circuit may be configured to, in response to the defective address in the initial target defective address information being the same as the defective address in the initial non-target defective address information, configure a second identification information as a second value for the corresponding defective address information. In some implementations, the second value included in the second identification information may indicate that the corresponding relationship between the defective address and the redundant address in the corresponding defective address information is invalid.

In some implementations, the defective address information processing circuit may be configured to determine whether the defective address in the initial target defective address information is the same as the defective address in the initial non-target defective address information. In some implementations, the defective address information processing circuit may be configured to, in response to the defective address in the initial target defective address information being different from the defective address in the initial non-target defective address information, use the first identification information in the initial non-target defective address information as the second identification information in the defective address information. In some implementations, the defective address information processing circuit may be configured to, in response to the defective address in the initial target defective address information being the same as the defective address in the initial non-target defective address information, modify the first identification information in the initial non-target defective address information. In some implementations, the modified first identification information may be used as the second identification information in the defective address information.

In some implementations, the defective address information processing circuit may include a comparing circuit and an identification modifying circuit. In some implementations, the comparing circuit is connected to the first defective address information memory and is configured to compare the defective address in the initial target defective address information with the defective address in the initial non-target defective address information, and output a comparison result. In some implementations, the identification modifying circuit may be connected to the comparing circuit and may be configured to configure the second identification information for the corresponding defective address information based on the comparison result.

In some implementations, the comparing circuit may include a plurality of comparing sub-circuits, each of the comparing sub-circuits may be connected to the first defective address information memory and may be configured to compare initial target defective address information and one piece of initial non-target defective address information and output a sub-comparison result. In some implementations, the identification modifying circuit may include a plurality of identification modifying sub-circuits, each of the identification modifying sub-circuits may be connected to one of the plurality of comparing sub-circuits and the first defective address information memory, and may be configured to configure the second identification information for the corresponding defective address information based on the sub-comparison result.

In some implementations, the comparing sub-circuit may be an exclusive OR gate.

In some implementations, the defective address information processing circuit further may include a buffer. In some implementations, the buffer may be connected to the first defective address information memory, each of the comparing sub-circuits and the second defective address information memory and may be configured to store the initial target defective address information.

In some implementations, the first defective address information memory may include a plurality of first memory areas arranged in sequence. In some implementations, a first one of the first memory areas may be connected to the buffer and is configured to store the initial target defective address information. In some implementations, each first memory area other than the first one of the first memory areas may be connected to one of the comparing sub-circuits, and each first memory area other than the first one of the first memory areas may be configured to store the initial non-target defective address information. In some implementations, the second defective address information memory may include a plurality of second memory areas arranged in sequence. In some implementations, a first one of the second memory areas may be connected to the buffer and is configured to store the target defective address information. In some implementations, each second memory area other than the first one of the second memory areas may be connected to one of the modifying sub-circuits.

In some implementations, the second defective address information memory may be further connected to the first defective address information memory. In some implementations, the memory device may further include a determining circuit connected to the first defective address information memory and the defective address information processing circuit. In some implementations, the determining circuit may be configured to determine whether a defective address and a redundant address corresponding to the defective address are stored in the first one of the first memory areas according to the first identification information in the first one of the first memory areas, and output a determination result. In some implementations, the determining circuit may be configured to, in response to the determination result indicating that the defective address and the redundant address corresponding to the defective address are not stored in the first one of the first memory areas, prohibit the defective address information processing circuit from modifying the initial non-target defective address information, and the initial non-target defective address information is directly output to the second defective address information memory as defective address information. In some implementations, the determining circuit may be configured to, in response to the determination result indicating that the defective address and the redundant address corresponding to the defective address are stored in the first one of the first memory areas, enable the defective address information processing circuit to modify the initial non-target defective address information.

In some implementations, a redundant address in the initial target defective address information may include a post-encapsulation repair redundant address, and a redundant address in the initial non-target defective address information may include a pre-encapsulation repair redundant address.

In some implementations, the memory device may include a three-dimensional dynamic random access memory device.

According to another aspect of the present disclosure, a memory system is provided. The memory system may include a memory controller and a memory device. The memory controller may be coupled to the memory device and may be configured to control the memory device. The memory device may include a first defective address information memory. The first defective address information memory may be configured to store multiple pieces of initial defective address information, and the multiple pieces of initial defective address information may include initial target defective address information and multiple pieces of initial non-target defective address information. The memory device may include a defective address information processing circuit. The defective address information processing circuit may be connected to the first defective address information memory. The defective address information processing circuit may be configured to compare the initial target defective address information with each of the multiple pieces of initial non-target defective address information. The defective address information processing circuit may be configured to determine whether to process the initial non-target defective address information based on a comparison result. The defective address information processing circuit output multiple pieces of defective address information corresponding to the multiple pieces of the initial defective address information. The memory device may include a second defective address information memory. The second defective address information memory may be connected to the defective address information processing circuit, and is configured to store the multiple pieces of defective address information.

According to a further aspect of the present disclosure, a memory device is provided. The memory device may include a first defective address information memory that includes a plurality of first memory areas arranged in sequence. The memory device may include a defective address information processing circuit comprising a plurality of comparing sub-circuits and a plurality of modifying sub-circuits. One of the comparing sub-circuits may be connected to a first memory area other than a first one of the first memory areas, and one of the modifying sub-circuits may be connected to one of the comparing sub-circuits and the first memory area to which the comparing sub-circuit is connected. The memory device may include a second defective address information memory including a plurality of second memory areas arranged in sequence. Each second memory area other than a first one of the second memory areas may be connected to one of the modifying sub-circuits, and the first one of the first memory areas may be connected to the first one of the second memory areas.

In some implementations, the defective address information processing circuit may further include a buffer, and the buffer may be connected to the first one of the first memory areas, each of the comparing sub-circuits and the first one of the second memory areas.

In some implementations, the comparing sub-circuit may be an exclusive OR gate.

According to yet another aspect, the present disclosure provides a method of operating a memory device. The method may include comparing the initial target defective address information with each piece of initial non-target defective address information, and outputting a comparison result. The method may include determining whether to process the initial non-target defective address information based on the comparison result, and outputting multiple pieces of defective address information corresponding to multiple pieces of initial defective address information.

In some implementations, each of the multiple pieces of initial defective address information may include at least a first identification information, the first identification information may indicate whether the corresponding initial defective address information includes a defective address and a redundant address corresponding to the defective address. In some implementations, each of the multiple pieces of defective address information may include a defective address, a second identification information, and a redundant address corresponding to the defective address. In some implementations, the second identification information may indicate whether a corresponding relationship between the defective address and the redundant address is valid.

In some implementations, the comparing a defective address in the initial target defective address information with a defective address in the initial non-target defective address information and outputting a comparison result may include comparing the initial target defective address information with one piece of initial non-target defective address information at each time and outputting a sub-comparison result.

In some implementations, the determining whether to process the initial non-target defective address information based on the comparison result and outputting multiple pieces of defective address information corresponding to multiple pieces of initial defective address information may include determining whether the defective address in the initial target defective address information is the same as the defective address in the initial non-target defective address information. In some implementations, the determining whether to process the initial non-target defective address information based on the comparison result and outputting multiple pieces of defective address information corresponding to multiple pieces of initial defective address information may include, in response to the defective address in the initial target defective address information being different from the defective address in the initial non-target defective address information, configuring a second identification information as a first value for the corresponding defective address information, the first value included in the second identification information indicates that the corresponding relationship between the defective address and the redundant address in the corresponding defective address information is valid. In some implementations, the determining whether to process the initial non-target defective address information based on the comparison result and outputting multiple pieces of defective address information corresponding to multiple pieces of initial defective address information may include, in response to the defective address in the initial target defective address information being the same as the defective address in the initial non-target defective address information, configuring a second identification information as a second value for the corresponding defective address information, the second value included in the second identification information indicates that the corresponding relationship between the defective address and the redundant address in the corresponding defective address information is invalid.

In some implementations, the determining whether to process the initial non-target defective address information based on the comparison result and outputting multiple pieces of defective address information corresponding to multiple pieces of initial defective address information may include determining whether the defective address in the initial target defective address information is the same as the defective address in the initial non-target defective address information. In some implementations, the determining whether to process the initial non-target defective address information based on the comparison result and outputting multiple pieces of defective address information corresponding to multiple pieces of initial defective address information may include, in response to the defective address in the initial target defective address information being different from the defective address in the initial non-target defective address information, using the first identification information in the initial non-target defective address information as the second identification information in the defective address information. In some implementations, the determining whether to process the initial non-target defective address information based on the comparison result and outputting multiple pieces of defective address information corresponding to multiple pieces of initial defective address information may include, in response to the defective address in the initial target defective address information being the same as the defective address in the initial non-target defective address information, modifying the first identification information in the initial non-target defective address information, wherein the modified first identification information is used as the second identification information in the defective address information.

According to yet a further aspect of the present disclosure, a computer-readable storage medium storing instructions is provided. The instructions, which when executed by a processor, may cause the processor to compare the initial target defective address information with each piece of initial non-target defective address information, and outputting a comparison result. The instructions, which when executed by a processor, may cause the processor to determine whether to process the initial non-target defective address information based on the comparison result, and output multiple pieces of defective address information corresponding to multiple pieces of initial defective address information.

BRIEF DESCRIPTION OF THE DRAWINGS

The similar reference numerals in the drawings may present similar components in different views. The similar reference numerals with different letter suffixes may denote different examples of similar components. The drawings generally illustrate, by way of example and not limitation, various implementations discussed herein.

DETAILED DESCRIPTION

Figure 1:
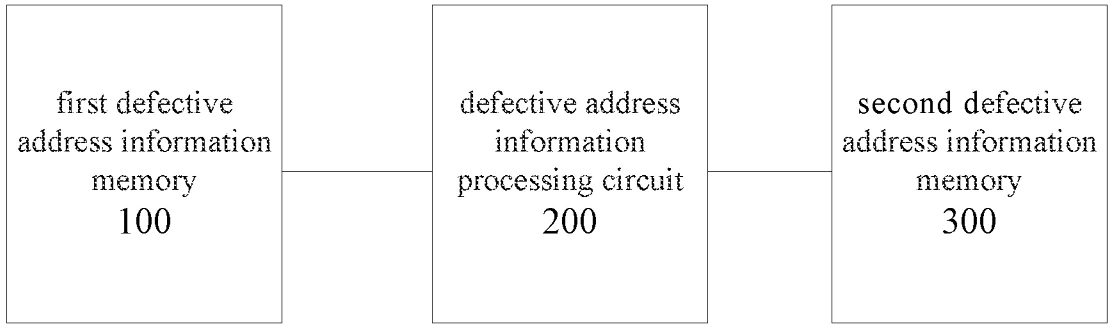
FIGS. 1-4 are schematic diagrams of a memory device provided by some implementations of the present disclosure, the memory device includes a first defective address information memory, a defective address information processing circuit and a second defective address information memory.

For ease of understanding the invention, a more complete description of the application will be given below with reference to the drawings. The preferred implementations of the application are shown in the drawings. However, the disclosure may be implemented in many different forms and is not limited to the implementations described herein. Rather, these implementations are provided for the purpose of making the disclosure of the present disclosure more thorough and comprehensive.

Unless otherwise defined, all technical and scientific terms used herein have the same meanings as are commonly understood by those skilled in the art. The terms used herein in the specification of the application are for the purpose of describing specific implementations only and are not intended to limit the application. As used herein, the term "and/or" includes any and all combinations of one or more related listed items.

Generally, a first performance test may be performed on a memory array in a memory device before the memory device leaves the factory or before encapsulation. When a defect is found in a column (row) of memory cells in the memory array, a first repair and replacement operation may be carried out on the memory device. Specifically, the first repair and replacement operation may record the column (row) address of the defective memory cell (e.g., a defective address) and replace the defective address with a first redundant address. When an access address is sent from outside (e.g., a host), the defective address may be compared with the external access address. If the comparison result shows that the external access address is the same as the defective address, a decoder may output the first redundant address corresponding to the defective address so as to realize the repair and replacement, thus ensuring the normal operation of the memory. If the comparison result shows that the external access address is different from the defective address, the external access address may be directly used to perform various operations on the memory device.

The memory cells within the memory device may further deteriorate after leaving the factory or encapsulation, resulting in new defective addresses. Therefore, a second repair and replacement operation may also be carried out on the memory device after leaving the factory or encapsulation. In particular, the column (row) address (e.g., the defective address) of the defective memory cell may be recorded and replaced with a second redundant address. However, the first repair and replacement operation and the second repair and replacement operation may perform two repairs and replacements for the same defective address, resulting in two different redundant addresses for replacing the defective address, thus causing a repair conflict. This may result in errors or failures in the subsequent external access to the memory device.

As shown in FIG. 1, a memory device of the present disclosure is shown. The memory device may include a first defective address information memory 100 configured to store multiple pieces of initial defective address information, the multiple pieces of initial defective address information include initial target defective address information and multiple pieces of initial non-target defective address information. The memory device may include a defective address information processing circuit 200 connected to the first defective address information memory 100. The defective address information processing circuit 200 may be configured to compare the initial target defective address information with each of the multiple pieces of initial non-target defective address information, determine whether to process the initial non-target defective address information based on a comparison result, and output multiple pieces of defective address information corresponding to the multiple pieces of the initial defective address information. The memory device may include a second defective address information memory 300, which is connected to the defective address information processing circuit 200 and is configured to store the multiple pieces of defective address information.

In some implementations, the first defective address information memory 100 may be a read only memory (ROM), including but not limited to, programmable ROM (PROM), erasable programmable read only memory (EPROM), one time programmable read only memory (OPTROM), electronically erasable programmable read-only Memory (EPROM).

The memory cells in the read-only memory include, but are not limited to, fuse/anti-fuse cells and transistors. In some implementations, a memory cell may be programmed by burning a fuse/anti-fuse cell. If a memory cell is a fuse cell, the stored data before burning may be regarded as "1", and the stored data after burning may be regarded as "0". If the memory cell is an anti-fuse cell, the stored data before burning may be regarded as "0", and the stored data after burning may be regarded as "1".

In some implementations, a transistor may be programmed by selecting to implant ions into the transistor or selecting not to implant ions into the transistor. For example, a transistor in which ions are implanted may be regarded as storing data "1" and a transistor in which ions are not implanted may be regarded as storing data "0".

In some implementations, a first performance test may be performed on a memory array in a memory device before the memory device leaves the factory. According to a result of the first performance test, a first programing may be performed on a first area of the first defective address information memory 100 to write multiple pieces of initial non-target defective address information therein. In some implementations, the initial non-target defective address information includes a defective address and a redundant address corresponding to the defective address. Here, the redundant address is a backup address of the defective address. When the defective address is selected, the redundant address may be used instead of the defective address.

In some implementations, the defective address encountered during the process may be repaired after the memory device leaves the factory. For example, a second programming may be performed on a second area of the first defective address information memory 100 by using a dedicated programmer to write initial target defective address information therein. In some implementations, the initial target defective address information includes a defective address and a redundant address corresponding to the defective address. The second area and the first area are different areas in the first defective address information memory 100. The initial target defective address information and the initial non-target defective address information may be collectively referred to as multiple pieces of initial defective address information.

In some implementations, the stored information in the first defective address information memory 100 is fixed once written, and the information will not be lost even if the power is cut off.

The second defective address information memory 300 may be a random access memory (RAM) including but not limited to, dynamic RAM (DRAM), static RAM (SRAM), synchronous DRAM (SDRAM). It is understood that a reading and writing speed of the second defective address information memory 300 is much faster than those of the first defective address information memory 300.

In some implementations, the stored information in the second defective address information memory 300 will be lost if the power is cut off after writing and needs to be rewritten.

In some implementations, a defective address information processing circuit 200 is added to compares the multiple pieces of initial non-target defective address information written in the first defective address information memory 100 with the initial target defective address information one by one to determine whether there is the same information in the multiple pieces of initial non-target defective address information as the initial target defective address information. The word "same" here may mean that all the information contents of a piece of initial non-target defective address information are the same as all the information contents of the initial target defective address information, or partial of the information contents of a piece of initial non-target defective address information are the same as a partial of the information contents of the initial target defective address information. In some implementations, if the comparison result is same, the initial non-target defective address information having the same information as the initial target defective address information may be modified, and the modified initial defective address information may be used as the defective address information. It is also possible to directly configure the defective address information to be a second value indicating that a corresponding relationship between the defective address and the redundant address in the corresponding defective address information is invalid. In other implementations, if the comparison result is different, the initial non-target defective address information having different information from the initial target defective address information may not be modified, but the initial defective address information may be directly used as the defective address information. It is also possible to directly configure the defective address information to be a first value indicating that a corresponding relationship between the defective address and the redundant address in the corresponding defective address information is valid. Here, one skilled in the art may choose from the above aspects according to the actual application requirements.

The multiple pieces of defective address information stored in the second defective address information memory 300 are valid information used by the memory device finally to compares with an external access address. When an access address is sent from the outside, the external access address may be compared with the multiple pieces of defective address information in the second defective address information memory 300. When the comparison result shows that the access address sent from the outside is the same as the defective address in the second defective address information memory 300, the access address sent from the outside is replaced with the redundant address corresponding to the defective address to perform corresponding read and write operations. When the comparison result shows that the access address sent from the outside is different from the defective address in the second defective address information memory 300, the access address sent from the outside is directly used to perform corresponding read and write operations.

In some implementations, the second defective address information memory 300 may be a content addressable memory (CAM), and the CAM may be a cache memory. The access address sent from the outside is directly compared with the defective address in the CAM. If the comparison result is same, the redundant address corresponding to the defective address will be returned. If the comparison result is different, the redundant address will not be returned.

In some implementations, the second defective address information memory is closer to the memory array in the memory device than the first defective address information memory. In this way, it is more conducive to speeding up the response speed of the second defective address information memory, and improve the reading and writing speed of the memory device.

In some implementations, the problem of repair conflict caused by one defective address corresponding to two redundant addresses when the defective address in the initial target defective address information is the same as the defective address in the initial non-target defective address information may be effectively avoid, by adding the defective address information processing circuit 200 to compare the multiple pieces of initial non-target defective address information written in the first defective address information memory 100 with the initial target defective address information one by one, and determine whether to process the initial non-target defective address information according to the comparison result. In some implementations, one defective address only corresponds to one redundant address, thereby improving the accuracy and efficiency of data reading in the memory device.

In some implementations, each piece of initial defective address information includes at least a first identification information, the first identification information indicates whether the corresponding initial defective address information includes a defective address and a redundant address corresponding to the defective address.

In some implementations, each piece of defective address information includes a defective address, a second identification information, and a redundant address corresponding to the defective address, wherein the second identification information indicates whether a corresponding relationship between the defective address and the redundant address is valid.

The initial defective address information includes at least first identification information, which is used to indicate what information is included in the initial defective address information. In some implementations, the first identification information may be a first value (e.g., binary data "1"), which may indicate that the initial defective address information includes the first identification information (and the first identification information is "1"), a defective address, and a redundant address corresponding to the defective address. The first identification information may be a second value (for example, binary data "0"), which may indicate that the initial defective address information includes the first identification information (and the first identification information is "0") and does not include the defective address and the redundant address corresponding to the defective address. In other words, when the first identification information is the first value, it indicates that the current area has been written with the defective address and the redundant address corresponding to the defective address; and when the first identification information is the second value, it indicates that the current area has not been written yet with the defective address and the redundant address corresponding to the defective address. The "area" here may be the memory space required for a piece of initial defective address information.

The defective address information includes the second identification information. Each piece of defective address information includes a defective address, a second identification information, and a redundant address corresponding to the defective address. The second identification information is used to indicate whether a correspondence relationship between the defective address and the redundant address corresponding to the defective address is valid.

In some implementations, the second identification information is a first value, such as the binary data "1", indicating that the corresponding relationship between the defective address and the redundant address corresponding to the defective address is valid. The second identification information is a second value, such as binary data "0", indicating that the corresponding relationship between the defective address and the redundant address corresponding to the defective address is invalid.

In some implementations, the defective address information processing circuit may be configured to determine whether the defective address in the initial target defective address information is the same as the defective address in the initial non-target defective address information.

In some implementations, the defective address information processing circuit may be configured to, in response to the defective address in the initial target defective address information being different from the defective address in the initial non-target defective address information, configure a second identification information as a first value for the corresponding defective address information. The first value included in the second identification information may indicate that the corresponding relationship between the defective address and the redundant address in the corresponding defective address information is valid.

In some implementations, the defective address information processing circuit may be configured to in response to the defective address in the initial target defective address information being the same as the defective address in the initial non-target defective address information, configure a second identification information as a second value for corresponding defective address information. The second value included in the second identification information may indicate that the corresponding relationship between the defective address and the redundant address in the corresponding defective address information is invalid.

In some implementations, the defective address information processing circuit confirms whether one defective address corresponds to two redundant addresses by determining whether the defective address in the initial target defective address information is the same as the defective address in the initial non-target defective address information, and configures corresponding values for the second identification information in the defective address information according to the comparison result, and thus confirms whether the corresponding defective address information is valid according to the value included in the second identification information.

In some implementations, the second identification information in the defective address information is set to a second value if the comparison result is same. For example, the second value may be binary data "0".

In some implementations, the second identification information in the defective address information is set to a first value if the comparison result is different. For example, the first value may be binary data "1".

In some implementations, the value in the second identification information is set according to the result of comparing or determining between the defective address in the initial target defective address information and the defective address in the initial non-target defective address information by the defective address information processing circuit. The defective address information processing circuit may be connected to the second defective address information memory. The second identification information in the defective address information may be set directly by using the comparison result of the defective address information processing circuit.

In some implementations, in response to the defective address in the initial target defective address information being different from the defective address in the initial non-target defective address information, the first identification information in the initial non-target defective address information may be used as the second identification information in the defective address information.

In some implementations, in response to the defective address in the initial target defective address information being the same as the defective address in the initial non-target defective address information, the first identification information in the initial non-target defective address information may be modified. The modified first identification information may be used as the second identification information in the defective address information.

In some implementations, the defective address information processing circuit confirms whether the one defective address corresponds to two redundant addresses by determining whether the defective address in the initial target defective address information is the same as the defective address in the initial non-target defective address information, and confirms whether to modify the first identification information in the initial non-target defective address information according to the comparison result, and uses the modified first identification information as the second identification information in the defective address information. Whether the corresponding defective address information is duplicate address information may be confirmed according to the value of the second identification information, so that the problem of data reading and writing errors caused by the one defective address corresponding to a plurality of redundant addresses may be effectively avoided.

The implementations of the present disclosure focus on whether the one defective address corresponds to two or more redundant addresses. Therefore, the problem of address conflict may be avoided by finding a plurality of same defective addresses and enabling the corresponding relationship between one of the defective addresses and the redundant address corresponding to the defective address.

In some implementations, the value in the second identification information is set by modifying the first identification information in the initial defective address information according to the result of comparing or determining between the defective address in the initial target defective address information and the defective address in the initial non-target defective address information by the defective address information processing circuit.

In some implementations, if the comparison result is same, the first identification information in the initial non-target defective address information is set to a second value (e.g., binary data "0") to form the second identification information. At this time, since the initial non-target defective address information includes a defective address and a redundant address, the first identification information in the initial non-target defective address information is a first value "1". Since the comparison result is same, the first identification information having the first value needs to be modified as the second identification information having the second value, so the first value "1" in the first identification information may be modified to be the second value "0" and used as the second identification information.

In some implementations, if the comparison result is different, the first identification information in the initial non-target defective address information is set to the first value (for example, binary data "1") to form the second identification information. At this time, since the initial non-target defective address information includes a defective address and a redundant address, the first identification information in the initial non-target defective address information is the first value "1". Since the comparison result is different, the first identification information having the first value do not need to be modified as the second identification information having the first value, so the first identification information is directly used as the second identification information.

In some implementations, the defective address information processing circuit is configured to compare the defective address in the initial target defective address information and the defective address in the initial non-target defective address information. After the comparison, the defective address information processing circuit is to modify or not modify the value in the first identification information as the second identification information according to the comparison result.

Figure 2:
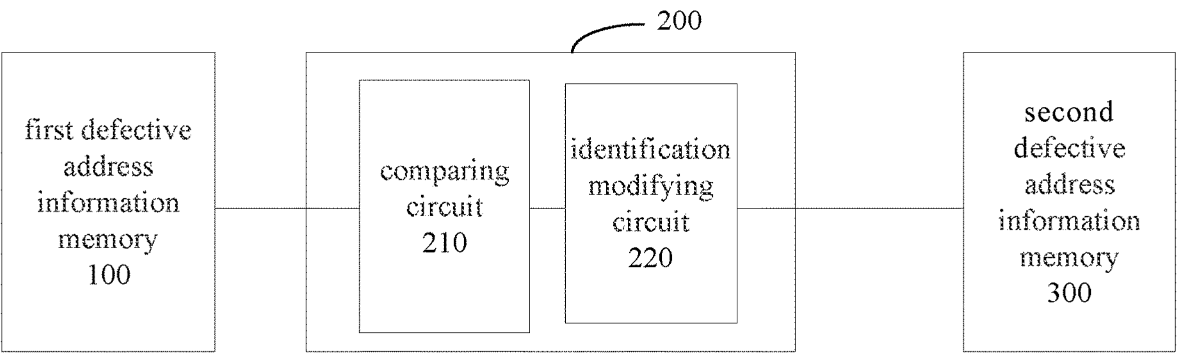

In some implementations, as shown in FIG. 2, a defective address information processing circuit ay include, e.g., a comparing circuit 210 and an identification modifying circuit 220. The comparing circuit 210 is connected to the first defective address information memory 100 and is configured to compare ae defective address in the initial target defective address information with a defective address in the initial non-target defective address information, and output a comparison result. The identification modifying circuit 220 is connected to the comparing circuit 210 and is configured to configure a second identification information for the corresponding defective address information based on the comparison result.

In some implementations, the defective address information processing circuit includes the comparing circuit 210 and the identification modifying circuit 220 to respectively implement the function of comparison and the function of configuring the second identification information.

In some implementations, the identification modifying circuit 220 is also connected to the second defective address information memory 300, and is configured to configure the second identification information for the corresponding defective address information according to the comparison result.

For example, if the comparison result is same, the identification modifying circuit 220 configures the second identification information as having a second value (for example, "0") for the corresponding defective address information.

For example, if the comparison result is different, the identification modifying circuit 220 configures the second identification information as having a first value (for example, "1") the corresponding defective address information.

Figure 3:
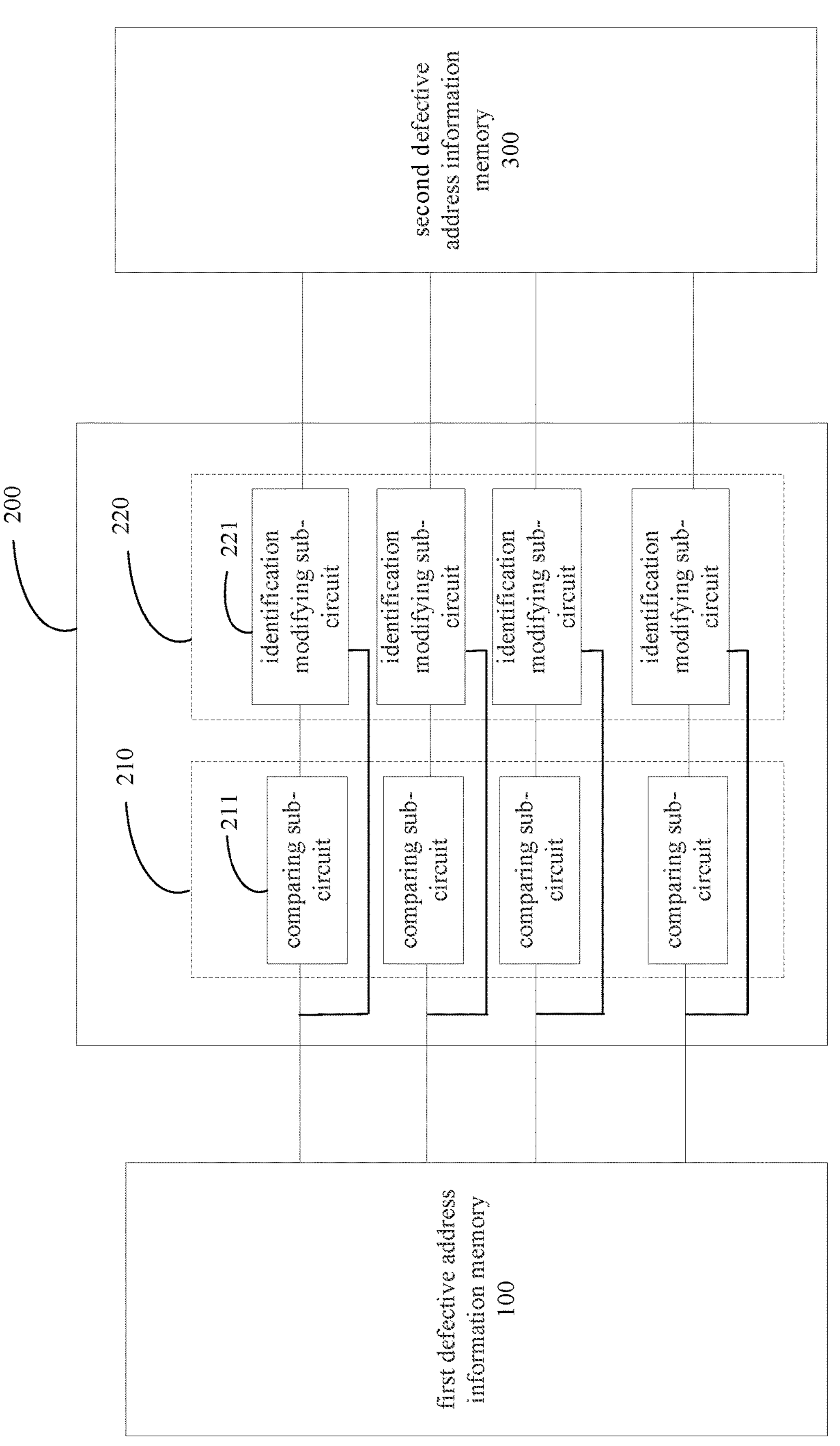

In some implementations, as shown in FIG. 3, the comparing circuit 210 includes a plurality of comparing sub-circuits 211, each comparing sub-circuit 211 is connected to the first defective address information memory 100 and is configured to compare the initial target defective address information and the initial non-target defective address information and output a sub-comparison result.

In some implementations, the identification modifying circuit 220 may include a plurality of identification modifying sub-circuits 221, each identification modifying sub-circuit 221 is connected to one comparing sub-circuit 211 and the first defective address information memory 100, and is configured to configure the second identification information for the corresponding defective address information based on the sub-comparison result.

In some implementations, a comparing sub-circuit 211 is configured to compare a defective address in one piece of initial non-target defective address information with a defective address in the initial target defective address information.

In some implementations, different comparing sub-circuits 211 receive different initial non-target defective address information. That is, different comparing sub-circuits 211 receive different defective addresses.

In some implementations, the number of comparing sub-circuits 211 may be the same as the maximum number of pieces of initial non-target defective address information that may be written in the first defective address information memory 100, so that when the first defective address information memory 100 is full of initial non-target defective address information, each piece of initial non-target defective address information may be compared with the initial target defective address information.

In some implementations, the number of identification modifying sub-circuits 221 is the same as the number of comparing sub-circuits 211. Each identification modifying sub-circuit 221 may be used to buffer the first identification information in one piece of initial non-target defective address information, modify and configure the buffered first identification information based on the received comparison result accordingly, and use it as the second identification information of the defective address information; or the second identification information of the defective address information may be directly configured according to the received comparison result.

Figure 4:
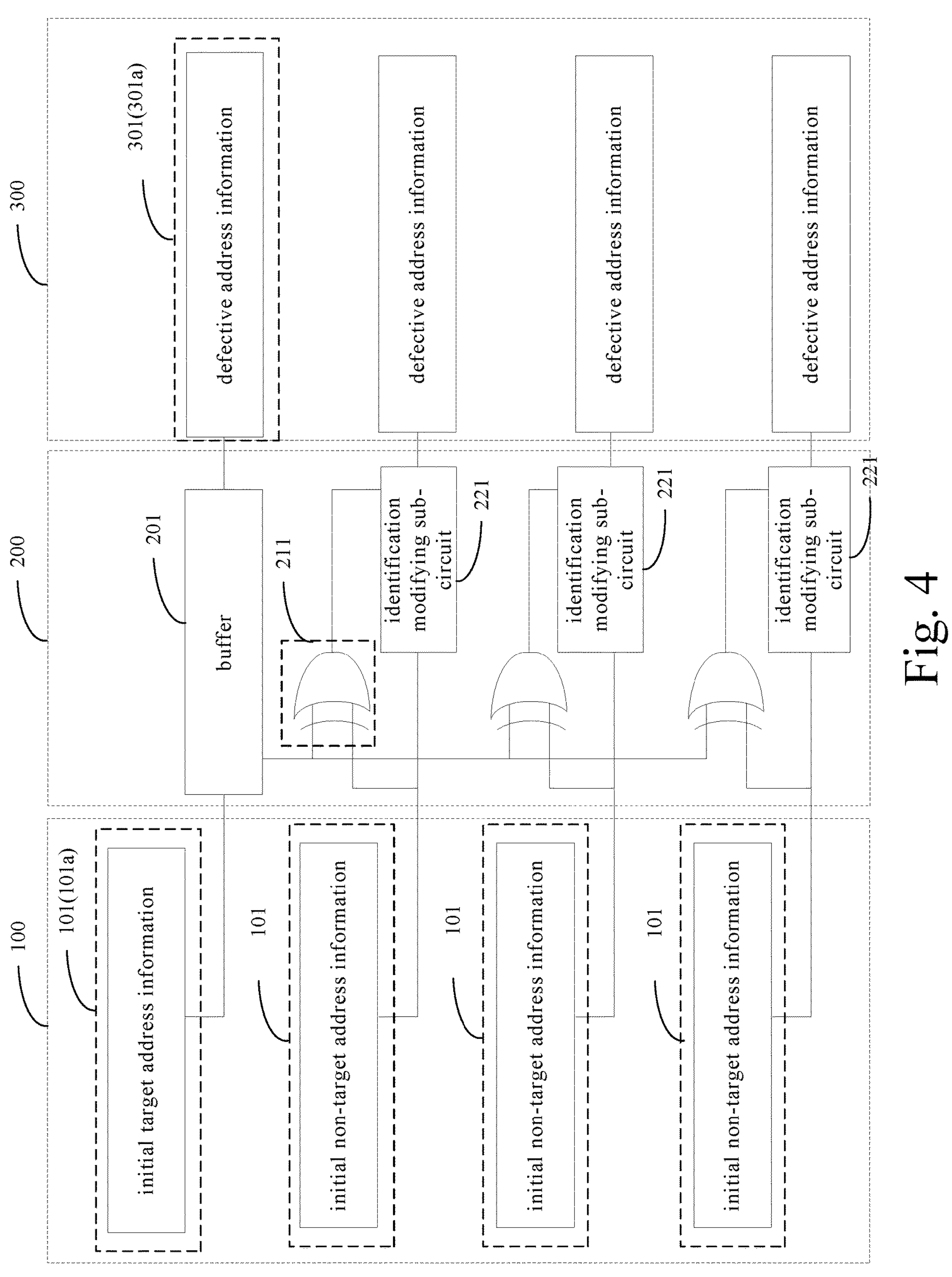

In some implementations, as shown in FIG. 4, the comparing sub-circuit 211 may include an exclusive OR gate.

It should be noted that the logic gates of the comparing sub-circuits in FIG. 4 are exemplary but not limited thereto, and may be other combinations having the same function as the logic gates in FIG. 4.

In some implementations, as shown in FIG. 4, the defective address information processing circuit 200 may further include a buffer 201. The buffer 201 may be connected to the first defective address information memory 100, each comparing sub-circuit 211 and the second defective address information memory 300 and is configured to store the initial target defective address information. The comparing sub-circuit 211 may be configured to receive the initial target defective address information.

In some implementations, the buffer 201 is connected to the first defective address information memory 100. The buffer 201 may also receive an input signal. With functioning of the input signal, the initial target defective address information in the first defective address information memory 100 is input to the buffer 201 which stores the initial target defective address information. The buffer 201 is also connected to each comparing sub-circuit 211. One input of each comparing sub-circuit 211 is configured to receive initial target defective address information. The buffer 201 is also connected to the second defective address information memory 300. The buffer 201 may also receive an output signal. With the functioning of the output signal, the initial target defective address information stored in the buffer 201 is output to the second defective address information memory 300.

In some implementations, as shown in FIG. 4, the first defective address information memory 100 includes a plurality of first memory areas 101 arranged in sequence; a first one 101*a* of the first memory areas is connected to the buffer 201 and is configured to store the initial target defective address information; each first memory area 101 other than the first one 101*a* of the first memory areas is connected to one comparing sub-circuit 211, and each first memory area other than the first one of the first memory areas is configured to store the initial non-target defective address information. The comparing sub-circuit 211 may be configured to receive the initial non-target defective address information.

The second defective address information memory 300 includes a plurality of second memory areas 301 arranged in sequence. A first one 301*a* of the second memory areas is connected to the buffer 201 and is configured to store the target defective address information. Each second memory area 301 other than the first one of the second memory areas is connected to one identification modifying sub-circuit 221 and is configured to store the non-target defective address information.

Arranging in sequence may refer to arranging in a certain order. In some implementations, it may be arranging in columns, that is, arranging according to the magnitude of the column addresses. The first defective address information memory 100 includes a plurality of first memory areas 101 arranged in columns, and each first memory area 101 may store a piece of initial defective address information. It may be understood that each first memory area 101 may have a column address. In some implementations, the column address of the first one 101*a* of the first memory areas may be the smallest, and the column address of the last one of the first memory areas may be the largest. From the first one 101*a* of the first memory areas to the last one of the first memory areas, the column address gradually increases. In other implementations, the column address of the first one 101*a* of the first memory areas may be the largest, and the column address of the last one of the first memory areas may be the smallest. From the first one 101*a* of the first memory areas to the last one of the first memory areas, the column addresses gradually decrease.

In some implementations, the first one 101*a* of the first memory areas is configured to store the initial target defective address information. The initial target defective address information may be written or burned during a second repair and replacement operation. For example, the initial target defective address information may include "defective address", "redundant address", and "first identification information".

Before the second repair and replacement operation is performed, although the first one 101*a* of the first memory areas may be used to store the initial target defective address information, the initial target defective address information at this time only includes the first identification information having the second value and actually does not store the "defective address" and "redundant address". In some implementations, taking an example for illustration, the defective address may be represented by 4-bit data, the redundant address may also be represented by 4-bit data, the first identification information may be represented by 1-bit data, and the memory cell in the first memory areas is an anti-fuse cell. It should be understood that the number of bits of the defective address, redundant address and first identification information is not limited to this. Therefore, the initial target defective address information at this time may be "000000000".

Each first memory area 101 other than the first one 101*a* of the first memory areas is configured to store the initial non-target defective address information. The initial non-target defective address information may be written or burned during a first repair and replacement operation the first time before leaving the factory or encapsulation. For example, the initial non-target defective address information may include "defective address", "redundant address", and "first identification information".

In some implementations, the buffer 201 is connected to the first one 101*a* of the first memory areas. The buffer 201 may also receive an input signal. With the functioning of the input signal, the initial target defective address information in the first one 101*a* of the first memory areas is input to the buffer 201 which store the initial target defective address information.

A first input of each comparing sub-circuit 211 is connected to the buffer 201, and a second input of each comparing sub-circuit 211 is connected to a first memory area other than the first one 101*a* of the first memory areas. Each comparing sub-circuit 211 is configured to compare the initial target defective address information with a piece of initial non-target defective address information. The output of each comparing sub-circuit 211 is connected to the identification modifying sub-circuit 211, and is used to modify the first identification information stored in the identification modifying sub-circuit 211.

The second defective address information memory 300 includes a plurality of second memory areas 301 arranged in sequence. The first one 301*a* of the second memory areas is connected to the buffer 201 and is configured to receive an input signal. With the functioning of the input signal, the first one 301*a* of the second memory areas receives and stores the initial target defective address information output from the buffer 201 as the target defective address information.

Each second memory area 301 other than the first one 301*a* of the second memory areas is connected to an identification modifying sub-circuit 221 and is configured to store the non-target defective address information. The initial non-target defective address information in the identification modifying sub-circuit 221 is modified and output as the non-target defective address information to each second memory area 301 other than the first one 301*a* of the second memory areas.

In some implementations, the second defective address information memory 300 is further connected to the first defective address information memory 100; and the memory device may further include a determining circuit 230 connected to the first defective address information memory 100 and the defective address information processing circuit 200.

In some implementations, the determining circuit 230 is configured to determine whether a defective address and a redundant address corresponding to the defective address are stored in the first one 101*a* of the first memory areas according to the first identification information in the first one 101*a* of the first memory areas, and output a determination result.

In some implementations, the determining circuit 230 is configured to, in response to the determination result indicating that the defective address and the redundant address corresponding to the defective address are not stored in the first one 101*a* of the first memory areas, prohibit the defective address information processing circuit 200 from modifying the initial non-target defective address information, and the initial non-target defective address information is directly output to the second defective address information memory 300 as the defective address information.

In some implementations, the determining circuit 230 is configured to, in response to the determination result indicating that the defective address and the redundant address corresponding to the defective address are stored in the first one 101*a* of the first memory areas, enable the defective address information processing circuit 200 to modify the initial non-target defective address information, and the modified initial non-target defective address information is output to the second defective address information memory 300 as defective address information.

In some implementations, if the first identification information in the first one 101*a* of the first memory areas is a first value, it may indicate that a second repair and replacement operation has been performed on the memory device. At this time, the first one 101*a* of the first memory areas stores a defective address, a redundant address corresponding to the defective address. If the first identification information in the first one 101*a* of the first memory areas is a second value, it may indicate that the second repair and replacement operation has not been performed on the memory device. The first one 101*a* of the first memory areas does not store the defective address and the redundant address corresponding to the defective address. Therefore, it is possible to determine whether the second repair and replacement operation has been performed on the memory device and whether the defective address and the redundant address corresponding to the defective address are stored in the first one 101*a* of the first memory areas according to the first identification information in the first one 101*a* of the first memory areas.

In some implementations, each first memory area 101 may include a first memory sub-area storing a defective address and a redundant address corresponding to the defective address, and a second memory sub-area storing the first identification information.

Figure 6A:
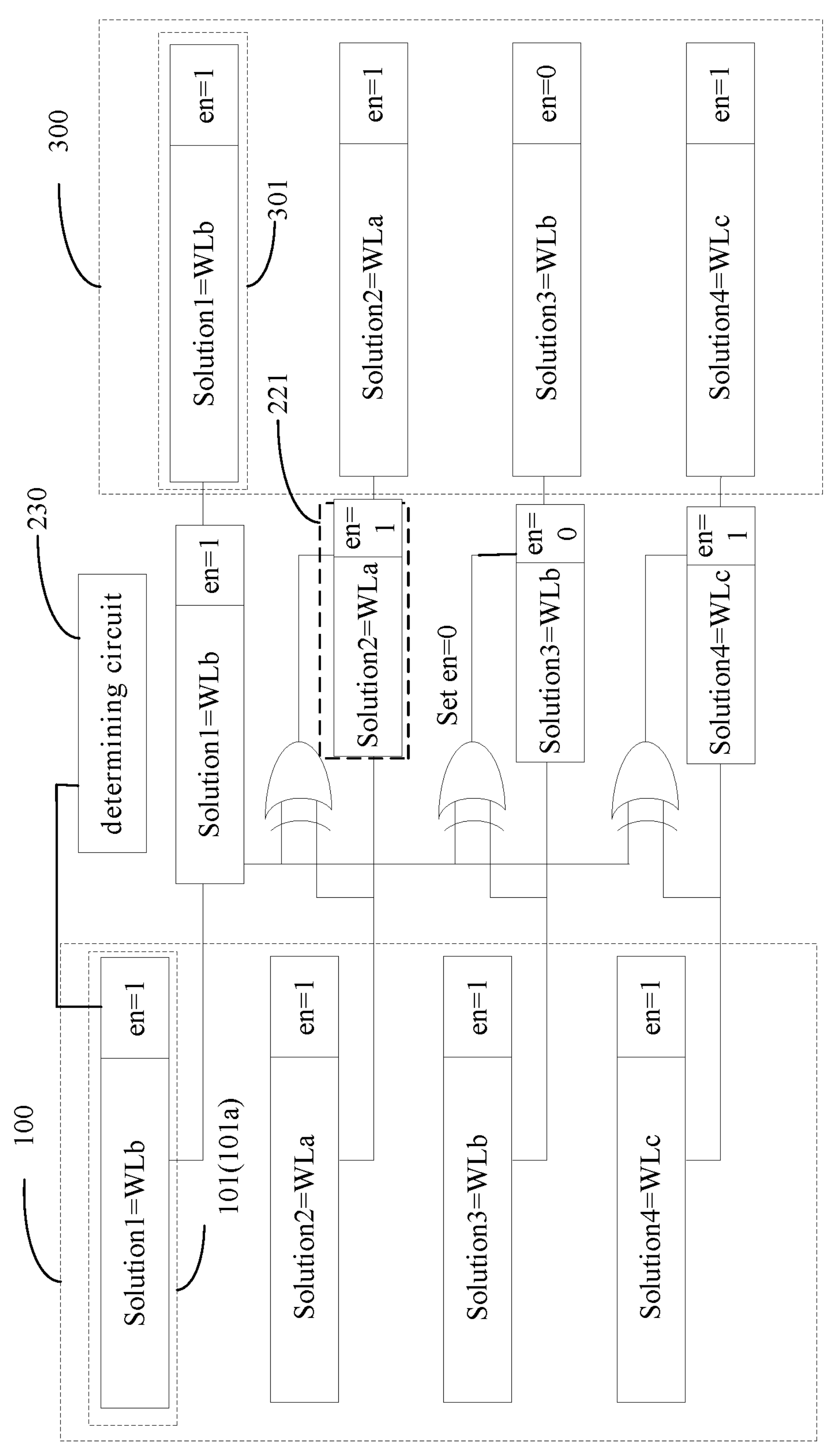
FIGS. 6A and 6B are schematic diagrams of a memory device provided by further implementations of the present disclosure, the memory device includes a first defective address information memory, a defective address information processing circuit and a second defective address information memory.

In some implementations, as shown in FIG. 6, the determining circuit 230 is connected to the first one 101*a* of the first memory areas, and determines whether the second repair and replacement operation has been performed by receiving and determining the value of the first identification information in the first one 101*a* of the first memory areas. The determining circuit 230 includes a logic gate.

If the determining circuit 230 determines that the value of the first identification information is a first value, it means that the second repair and replacement operation has been performed, and the defective address and the redundant address corresponding to the defective address are stored in the first one 101*a* of the first memory areas. If the determining circuit 230 determines that the value of the first identification information is a second value, it means that the second repair and replacement operation has not been performed, and the defective address and the redundant address corresponding to the defective address are not stored in the first one 101*a* of the first memory areas.

If the determining circuit 230 determines that the second repair and replacement operation has not been performed on the memory, the initial defective address information stored in the first defective address information memory 100 may be directly transmitted to the identification modifying sub-circuit 221, and the comparing circuit 210 may be disabled. The initial defective address information is then transmitted to the second defective address information memory 300 as the defective address information by the identification modifying sub-circuit 221.

If the determining circuit 230 determines that the second repair and replacement operation has been performed on the memory, the initial defective address information stored in the first defective address information memory 100 may be transmitted to the identification modifying sub-circuit 221, and each comparing sub-circuit 211 in the comparing circuit 210 may be enabled. The comparison result of each comparing sub-circuit 211 is transmitted to the identification modifying sub-circuit 221 to modify the first identification information of the identification modifying sub-circuit 221 as the second identification information. Then, the stored information in each identification modifying sub-circuit 221 is transmitted to the second defective address information memory 300 as the defective address information.

In some implementations, the determining circuit 230 may include a logic device such as NOR gate, OR gate and AND gate. For example, when the determining circuit 230 includes a NOT gate, input of the determining circuit 230 is connected to the second memory sub-area in the first one 101*a* of the first memory areas, so that the value of the first identification information in the first one 101*a* of the first memory areas may be determined according to the output of the NOT gate. As another example, when the determining circuit 230 includes an AND gate, both inputs of the determining circuit 230 are connected to the second memory sub-area in the first one 101*a* of the first memory areas, so that the value of the first identification information in the first one 101*a* of the first memory areas may be determined according to the output of the AND gate. According to the value of the first identification information in the first one 101*a* of the first memory areas, it can be determined whether the defective address and the redundant address corresponding to the defective address are stored in the first one 101*a* of the first memory areas.

The determining circuit 230 may further include a selector. The control end of the selector is configured to receive the output signal of the logic device. If the output signal of the logic device indicates that the defective address and the redundant address corresponding to the defective address are not stored in the first one 101*a* of the first memory areas, the defective address information processing circuit 200 is prohibited from modifying the initial non-target defective address information in response to the above result. The initial non-target defective address information may be directly output to the second defective address information memory 300 as non-target defective address information. It is to be understood that the prohibiting from modifying here may be either not performing any operation on the value in the initial non-target defective address information or overwriting it with the same value as the first identification information. For example, a first input of the selector may receive a fixed signal "1". Overwriting the first identification information of "1" with this signal "1" may also be termed as being prohibited from modifying, when considering in terms of numerical values. Alternatively, the first identification information may be connected to the first input of the selector to overwrite the first identification information in the modifying sub-circuit with the value of the first identification information.

If the output signal of the logic device indicates that the defective address and the redundant address corresponding to the defective address are stored in the first one 101*a* of the first memory areas, the defective address information processing circuit 200 is allowed to modify the initial non-target defective address information in response to the above result. In some implementations, the defective address information processing circuit 200 modifies the first identification information in the initial non-target defective address information, and the modified defective address information with the second identification information is output to the second defective address information memory 300. In some implementations, a second input of the selector may receive the comparison sub-result of the comparing sub-circuit 211, and modify the first identification information according to the comparison sub-result.

In some implementations, the number of pieces of initial defective address information written in the first defective address information memory 100 may be recorded using a counter (the initial value of the counter may be 0 when not written). The number of pieces of defective address information finally written in the second defective address information memory 300 should be the same as the final value of the counter. The remaining areas in the second defective address information memory may be overwritten with, for example, "000000000".

Figure 5:
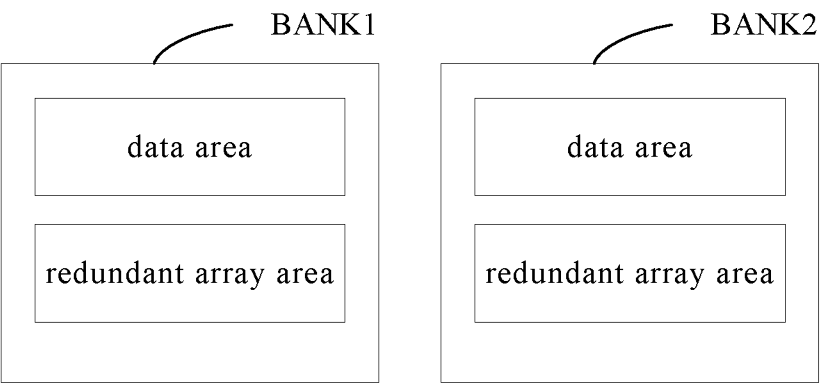
FIG. 5 is a schematic diagram of a plurality of repositories provided by implementations of the present disclosure.

In some implementations, as shown in FIG. 5, a memory array includes a plurality of banks such as BANK1 and BANK2, each bank includes a data area and a redundant array area. The data area is used for storing the data, and the redundant array area is used as the second defective address memory for storing the defective address and the corresponding redundant address.

In other embodiments, the memory array includes a plurality of banks. The second defective address information may be peripheral to the memory array. A second defective address memory may be provided close to a bank that corresponds to a second defective address memory. A second defective address memory may be provided close to many banks that share a second defective address memory.

An example implementation of the present disclosure is described below in conjunction with FIGS. 6B and 7.

Figure 7:
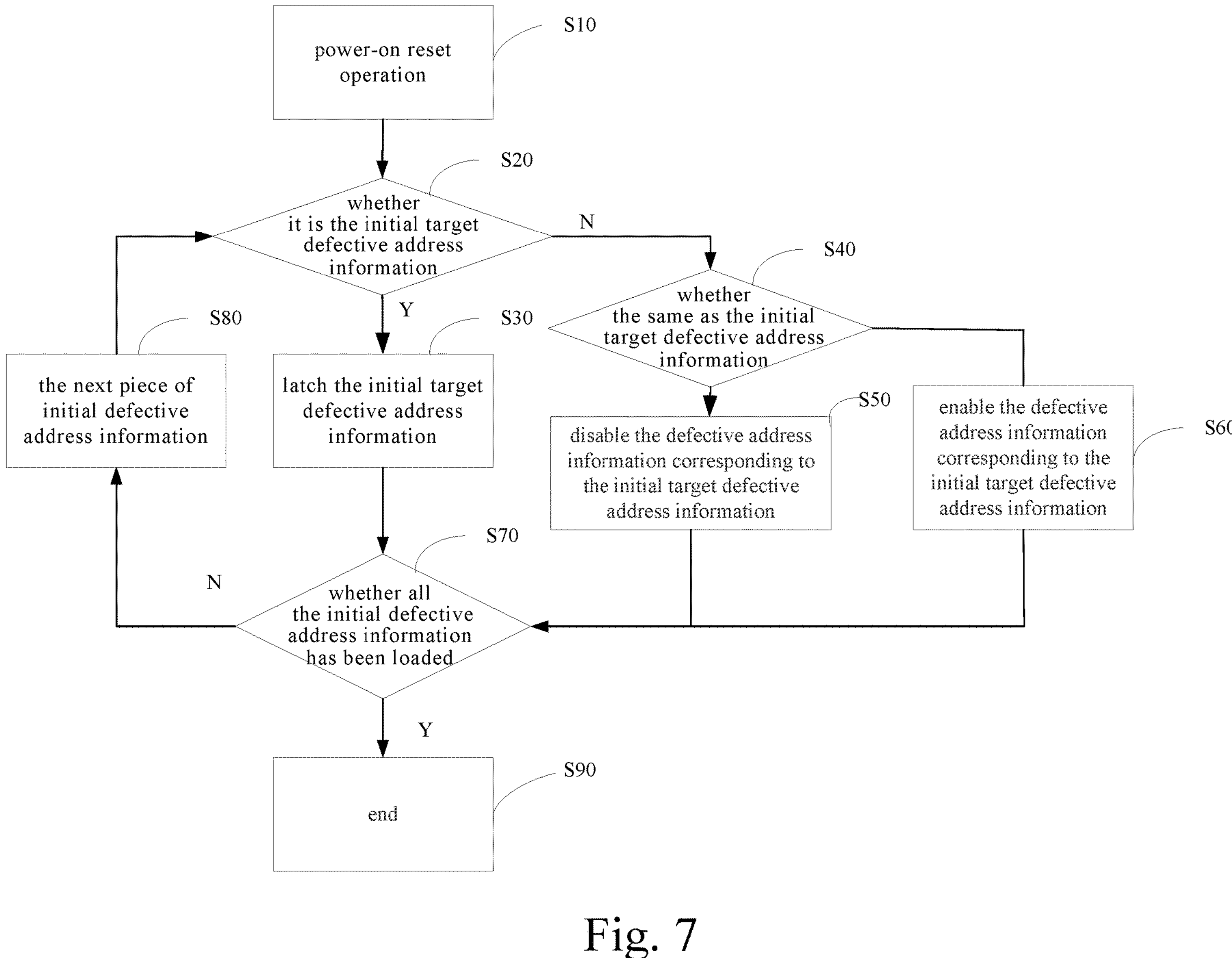
FIG. 7 is a schematic flow diagram of a framework used by the memory device provided by the implementations of the present disclosure.

Referring to FIG. 7, at operation S10, a memory controller performs a power-on reset operation in response to a power-on reset command.

At operation S20, the initial defective address information stored in the first defective address information memory 100 is determined, to determine whether it is the initial target defective address information. Here, the initial target defective address information may be stored in a designated first memory area in the first defective address information memory 100, and the column address of the designated first memory area may be recorded. Then, whether it is the initial target defective address information may be determined only by comparing the column address of the initial defective address information fetched each time with the recorded column address. In some implementations, the initial target defective address information may be stored in a first one of the first memory areas of the first defective address information memory 100.

Figure 6B:
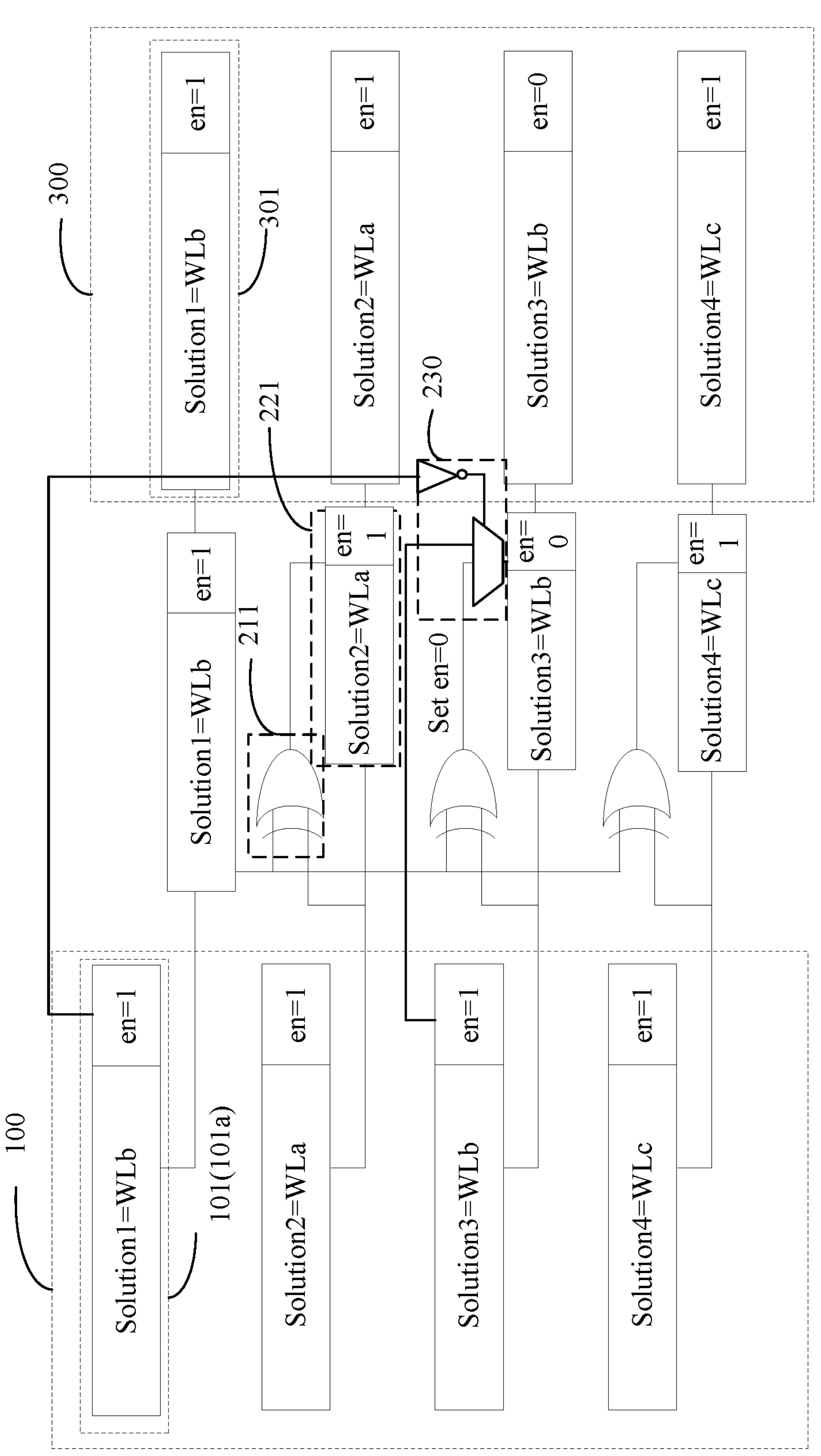

As shown in FIG. 6B, the first defective address information memory 100 includes a plurality of first memory areas 101 arranged in sequence, and the second defective address information memory 300 includes a plurality of second memory areas 301 arranged in sequence. The data written into the first one 101*a* of the first memory areas may be the initial target defective address information "Solution1=WLb, en=1", where Solution1 is the redundant address, WLb is the defective address, en=1 indicates that the first identification information en is of the first value "1".

The data written into the other first memory areas may be initial non-target defective address information, and may be "Solution2=WLa, en=1", "Solution3=WLb, en=" and "Solution4=WLc, en=1" in order.

Referring again to FIG. 7, after operation S20 is performed, it may be determined that the initial target defective address information is stored in the first one 101*a* of the first memory areas. At operation S30, the buffer 201 latches the initial target defective address information "Solution1=WLb, en=1". The first one 301*a* of the second memory areas receives the initial target defective address information "Solution1=WLb, en=1" from the buffer 201 as the target defective address information. It should be noted that the data in the buffer 201 still exists at this time. The data in the buffer 201 may be cleared at, before, or after the next power-on reset operation.

At operation S70, to determine whether all the initial defective address information in the first defective address information memory 100 has been loaded into the second defective address information memory 300, a counter may be set for counting. The initial value of the counter is the number of pieces of the initial defective address information stored in the first defective address information memory 100. Each time a piece of initial defective address information is loaded into the second defective address information memory 300, the value of the counter is reduced by one until the value of the counter is 0, indicating that all the information in the first defective address information memory 100 has been loaded into the corresponding second defective address information memory 300.

If not all the information has been loaded, at operation S80, the next piece of initial defective address information continues to be read.

After operation S20, it may be determined that the initial target defective address information is not stored in the first one 101*a* of the first memory areas, meaning it is the initial non-target defective address information. At operation S40, the initial non-target defective address information is compared with the initial target defective address. For instance, the comparison may be performed by a defective address information processing circuit 200 as shown in FIG. 6B, including a comparing circuit and an identification modifying circuit. The comparing circuit includes a plurality of comparing sub-circuits 211. In some implementations, the comparing sub-circuit 211 may be an exclusive OR gate. The identification modifying circuit includes a plurality of identification modifying sub-circuits 221. Each identification modifying sub-circuit 221 is connected to one of other first memory areas other than the first one of the first memory areas of the first defective address information memory 100. Each identification modifying sub-circuit 221 includes a third memory area for storing the initial non-target defective address information.

The determining circuit 230 includes a logic device (e.g., a NOT gate) and a selector. The input of the NOT gate receives the first identification information in the first one 101*a* of the first memory areas, and the first identification information is of a first value "1". The NOT gate outputs "0". The select end of the selector receives the data output by the NOT gate as a selection signal. At this time, the selection signal is "0", indicating that the defective address and redundant address are written into the first one 101*a* of the first memory areas. A first input of the selector is connected to the output of the exclusive OR gate. A second input of the selector may be used to receive a signal "1". The selector is configured to select to output the signal of the first input when the select end outputs "0", and select to output the signal of the second input when the select end outputs "1".

It should be noted that only one selector is shown in FIG. 6B. In some implementations, the number of selectors is the same as the number of exclusive OR gates. The first inputs of different selectors are connected to the outputs of different exclusive OR gates. The second input of each selector receives the signal "1". The select end of each selector receives the output of the NOT gate. The outputs of different selectors are connected to different identification modifying sub-circuits 221.

There are three exclusive OR gates shown in FIG. 6, where a first input of a first exclusive OR gate is used to receive the defective address "WLb" in the buffer 201. A second input of the first exclusive OR gate is used to receive the defective address "WLa" in the second one of the first memory areas of the first defective address information memory 100. "WLb" is different from "WLa". The output of the first OXR gate outputs the binary data "1". Since at this time, the determining circuit 230 selects to output the signal of the first input, after a first delay, the binary data "1" is output at the output of the first exclusive OR gate, and the first identification information stored in the first identification modifying sub-circuit 221 is overwritten. Here, since the first identification information stored in the first identification modifying sub-circuit 221 itself is numerically "1", it may be considered that the initial non-target defective address information has not been modified. The second one of the second memory areas receives the information "Solution 2=WLa, en=1" from the first identification modifying sub-circuit 221 as the non-target defective address information. That is, the operation S60 is performed and then the operation S70 continues. Because not all the initial defective address information has been loaded at this time, the operation S80 is continued to read the next piece of initial defective address information.

Continuing with operation S30, the next piece of initial defective address information is not the initial target defective address information.

Continuing with operation S40, to compare the initial non-target defective address information with the initial target defective address, a first input of a second exclusive OR gate is used to receive the defective address "WLb" in the buffer 201. A second input of the second exclusive OR gate is used to receive the defective address "WLb" in the third one of the first memory areas of the first defective address information memory 100. "WLb" is the same as "WLb". The output of the second exclusive OR gate outputs binary data "0". Since at this time, the determining circuit 230 selects to output the signal of the first input, after a first delay, the binary data "0" is output at the output end of the second exclusive OR gate, and the first identification information stored in the second identification modifying sub-circuit 221 is modified. The third one of the second memory areas receives the information "Solution3=WLb, en=0" from the second identification modifying sub-circuit 221, while at this time the second identification information is "0", indicating the corresponding relationship between the defective address and redundant address is invalid, and the non-target defective address information is prohibited to be used. That is, operation S50 is performed, and then operation S70 continues. Because not all the initial defective address information has been loaded at this time, operation S80 is continued to read the next piece of initial defective address information. Similar processing is performed until all the initial defective address information is loaded into the second defective address information memory 300, and then operation S90 is performed, and the flow ends.

In this way, by adding the defective address information processing circuit 200, the initial non-target defective address information that is duplicated with the initial target defective address information is successfully found, and the non-target defective address information corresponding to the initial non-target defective address information is disabled. This may avoid the problem of one defective address corresponding to multiple redundant addresses, causing errors when reading and writing operations are performed on the defective address.

In some implementations, a memory array includes multiple banks. Each bank may correspond to a first defective address information memory 100 and a second defective address information memory 300, or multiple banks may correspond to a first defective address information memory 100 and a second defective address information memory 300. The implementations of present disclosure may also compare multiple pieces of initial non-target defective address information written in each first defective address information memory 100 and initial target defective address information one by one, and load the comparison results into multiple corresponding second defective address information memory 300.

It should be understood that the above-mentioned numbers of the first memory areas 101, comparing sub-circuits 211, identification modifying sub-circuits 221 and second memory areas 301 are examples and may be adjusted according to actual usage conditions.

In some implementations, the redundant address in the initial target defective address information comprises a post-encapsulation repair redundant address, and the redundant address in the initial non-target defective address information may include a pre-encapsulation repair redundant address.

In some implementations, a first repair and replacement operation may occur before encapsulation, and the redundant address in the initial non-target defective address information includes a pre-encapsulation repair redundant address. A second repair and replacement operation may occur after encapsulation, and the redundant address in the initial target defective address information includes a post-encapsulation repair redundant address.

In some implementations, the memory device may include a three-dimensional dynamic random access memory device.

The memory provided by the implementations of present disclosure includes but is not limited to two-dimensional memory (e.g., two-dimensional dynamic random access memory), three-dimensional memory (e.g., three-dimensional dynamic random access memory).

The implementations of present disclosure further provide a memory system. The memory system may include a memory controller and a memory device according to any one of the above implementations, where the memory controller is coupled to the memory device and is configured to control the memory device.

The memory device and memory system will be further described below with reference to FIGS. 8 to 10B.

Figure 8:
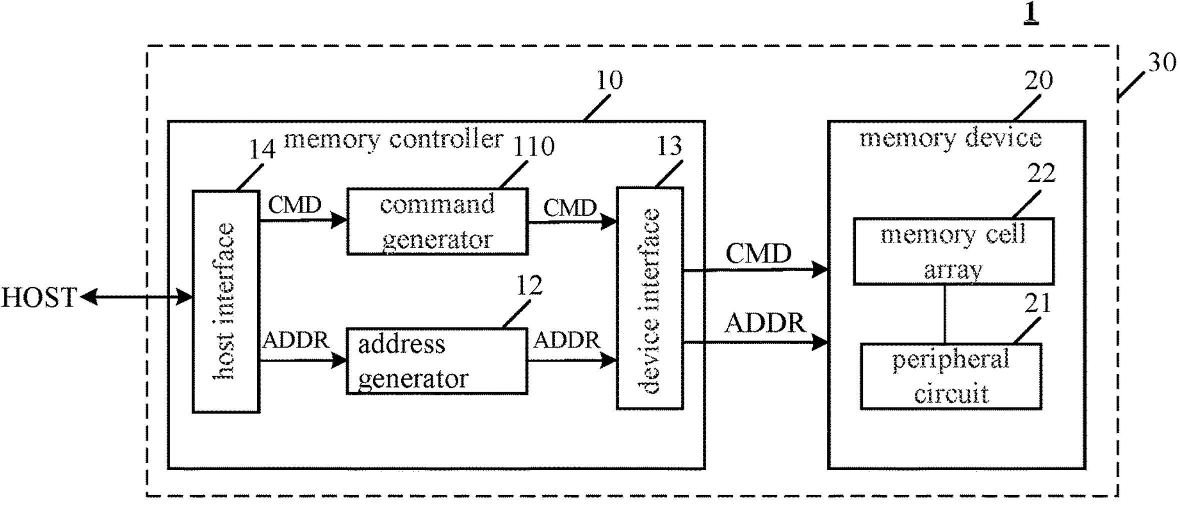
FIG. 8 is a schematic diagram of an example electronic device including a memory system provided by implementations of the present disclosure.

FIG. 8 is a schematic block diagram of an example electronic device, according to the implementations of the present disclosure. The electronic device 1 may be a mobile phone, desktop, laptop, tablet, vehicle computer, game console, printer, positioning device, wearable electronic device, smart sensor, virtual reality (VR) device, augmented reality (AR) device or any other electronic device having memory therein. As shown in FIG. 8, the electronic device 1 may include a host and a memory system 30, and the memory system 30 includes a memory controller 10 and one or more memory devices 20. The host may be the processor of the electronic device (for example, a central processing unit (CPU) or a graphics processing processor (GPU)). The host may be configured to send data to or receive data from memory device 20. The memory controller 10 is coupled to the memory device 20 and the host, and is configured to control memory device 20. The memory controller 10 may manage data stored in memory device 20 and communicate with the host.

The memory controller 10 may be configured to control operations of the memory device 20, such as read, erase, write and refresh operations. In some implementations, the memory controller 10 is further configured to process an error correction code (ECC) for data read from or written to the memory device 20. The memory controller 10 may also perform any other function such as formatting the memory device 20.

In some implementations, the memory controller 10 and one or more memory devices 20 may be integrated into various types of electronic devices. For example, the memory controller 10 may be integrated into a north bridge of a computer motherboard or directly into a computer CPU. The multiple memory devices 20 may be integrated into a memory chip. That is, the memory system 30 may be implemented and packaged into different types of terminal electronics.

The memory controller 10 may send/receive data to/from the host and may send a command CMD and an address ADDR to the memory device 20. The memory controller 10 may include a command generator 11, an address generator 12, a device interface 13 and a host interface 14. The host interface 14 may receive a command CMD and an address ADDR from the host. The command generator 11 may generate an access command or the like by decoding the command CMD received from the host, and may provide the access command to the memory device 20 through the device interface 13. The access command may be a signal that instructs the memory device 20 to write or read data by accessing a row of the memory cell array 22 corresponding to the address ADDR. The address generator 12 in the memory controller 10 may generate row address and column address to be accessed in the memory cell array 22 by decoding the address ADDR received from the host interface 14. In addition, the memory device 20 may generate address of a bank to be accessed when the memory cell array 22 includes a plurality of banks.

Additionally, the memory controller 10 may control memory operations such as write and read by providing various signals to the memory device 20 via the device interface 13. For example, the memory controller 10 may provide a write command to the memory device 20. The write command is used to instruct the memory device 20 to perform a write operation to store data into the memory device 20.

In some implementations, the memory device 20 includes a memory cell array 22 and a peripheral circuit 21. The memory cell array 22 includes a plurality of banks, each bank includes a plurality of blocks, each block includes a plurality of memory cell rows and a plurality of memory cell columns, each memory cell row is coupled to a corresponding word line, and each memory cell column is coupled to a corresponding bit line. The peripheral circuit 21 may write data to or read data from the memory cell array 22 based on the command CMD and address ADDR received from the memory controller 10, or may provide a control signal CTRL for refreshing memory cells included in the memory cell array 220 to the row decoding circuit and the column decoding circuit. In other words, the peripheral circuit 21 may perform all operations to process data in the memory cell array 22. The peripheral circuit 21 may include a control circuit corresponding to each block (e.g., such as a sensing amplifier (SA) and a word-line driver (WLD) and the like), a control circuit corresponding to each bank such as a row decoding circuit, a column decoding circuit and the like, and a control circuit corresponding to all banks such as a command buffer, a command decoder, an address buffer, a data input/output buffer, a mode register, and the like.

The memory device 20 may be a random access memory (RAM) such as dynamic random access memory (DRAM), synchronous DRAM (SDRAM), static RAM (SRAM), double data rate SDRAM (DDR SDRAM), DDR2 SDRAM, DDR3 SDRAM, phase change RAM (PRAM), magnetic RAM (MRAM), resistive RAM (RRAM) and the like. The following illustrations take DRAM as an example.

Figure 9A:
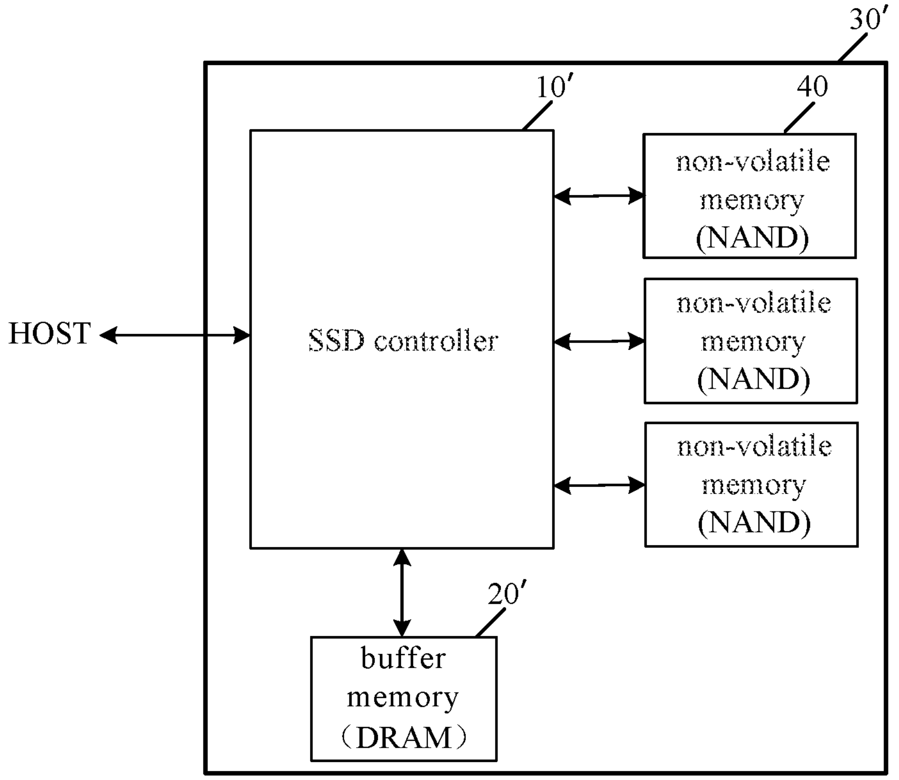
FIGS. 9A and 9B are schematic diagrams of a memory system provided by implementations of the present disclosure.

FIG. 9A is a schematic block diagram of an example solid state drive (SSD), according to an implementation of the present disclosure. Here the SSD may be understood as one of the memory systems described above in FIG. 8, in which the DRAM may be used as a buffer memory.

The SSD 30' as shown in FIG. 9A may include an SSD controller 10', a buffer memory 20' and a non-volatile memory 40. The SSD controller 10' may provide a physical connection between the host and the SSD 30'. That is, the SSD controller 10' may provide an interface between the host and the SSD 30' in accordance with the bus format of the host. The SSD controller 10' may decode instructions supplied from the host. The SSD controller 10' may access the non-volatile memory 40 based on the decoding result. The buffer memory 20' may temporarily store written data supplied from the host or data read from the non-volatile memory 40. When the host issues a read request, if the data in the non-volatile memory 40 is cached, the buffer memory 20' may support a cache function for providing the cached data directly to the host. The data transfer rate over the host bus format (e.g., SATA or SAS) is much higher than the data transfer rate over the memory channel of the SSD 30'. That is, the performance reduced due to the speed difference when the interface speed of the host is significantly high can be minimized by providing a high capacity buffer memory 20'. Additionally, the buffer memory 20' may store an address mapping table of the non-volatile memory 40. The buffer memory 20' may include, but is not limited to, DRAM. The non-volatile memory 40 may be set as a storage medium of the SSD 30'. The non-volatile memory 40 may include, but is not limited to, NAND memory.

Figure 9B:
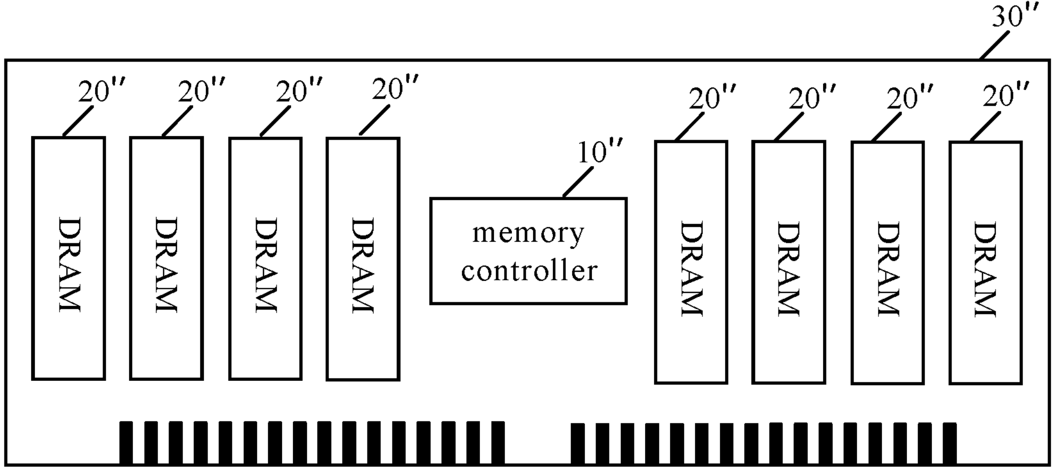

FIG. 9B is a schematic block diagram of an example memory, according to an implementation of the present disclosure. Here, the memory may be understood as one of the above memory systems of FIG. 8, in which DRAM may be used as a storage medium.

As shown in FIG. 9B, the memory 30" may be easily attached or installed to or detached from the electronic device 1 through the illustrated interface. The memory 30" may include a plurality of volatile memories 20" (for example, DRAM) and a memory controller 10". The memory 30" may be used to write data, store data, obtain (or read) data and/or erase data under the control of the computer's processor. In some implementations, the memory controller 10" may communicate with DRAM using at least one communication protocol or technical standard associated with for example dual inline memory modules (DIMMs), registered DIMMs (RDIMM), low load DIMMs (LRDIMM), unregistered DIMMs (UDIMM) and so on.

It should be noted that the buffer memory 20' in FIG. 9A and the volatile memory 20" in FIG. 9B are both application scenarios of the memory device 20 in FIG. 8.

Figure 10A:
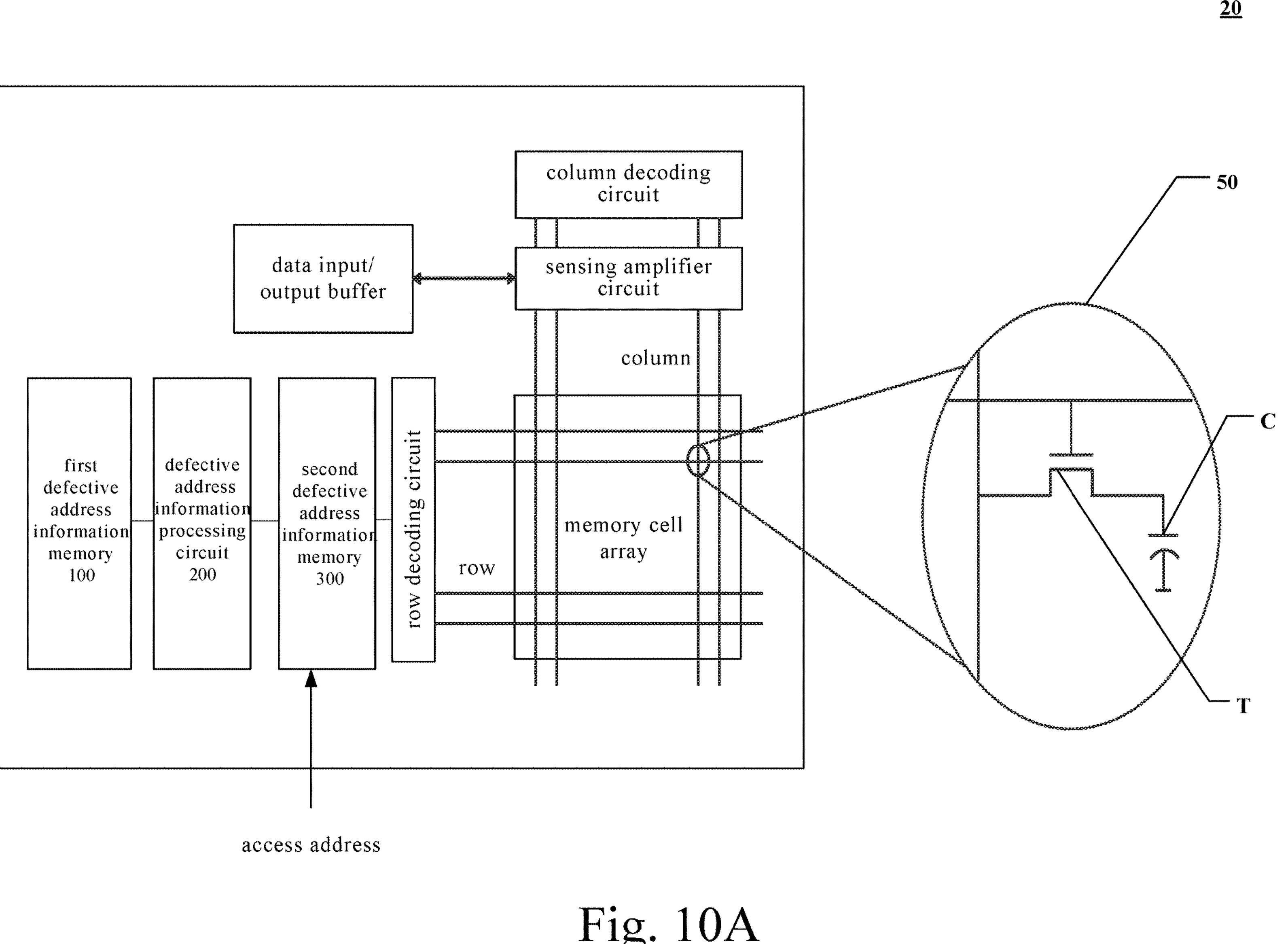
FIGS. 10A and 10B are schematic diagrams of a peripheral circuit and memory cell array provided by implementations of the present disclosure.
Figure 10B:
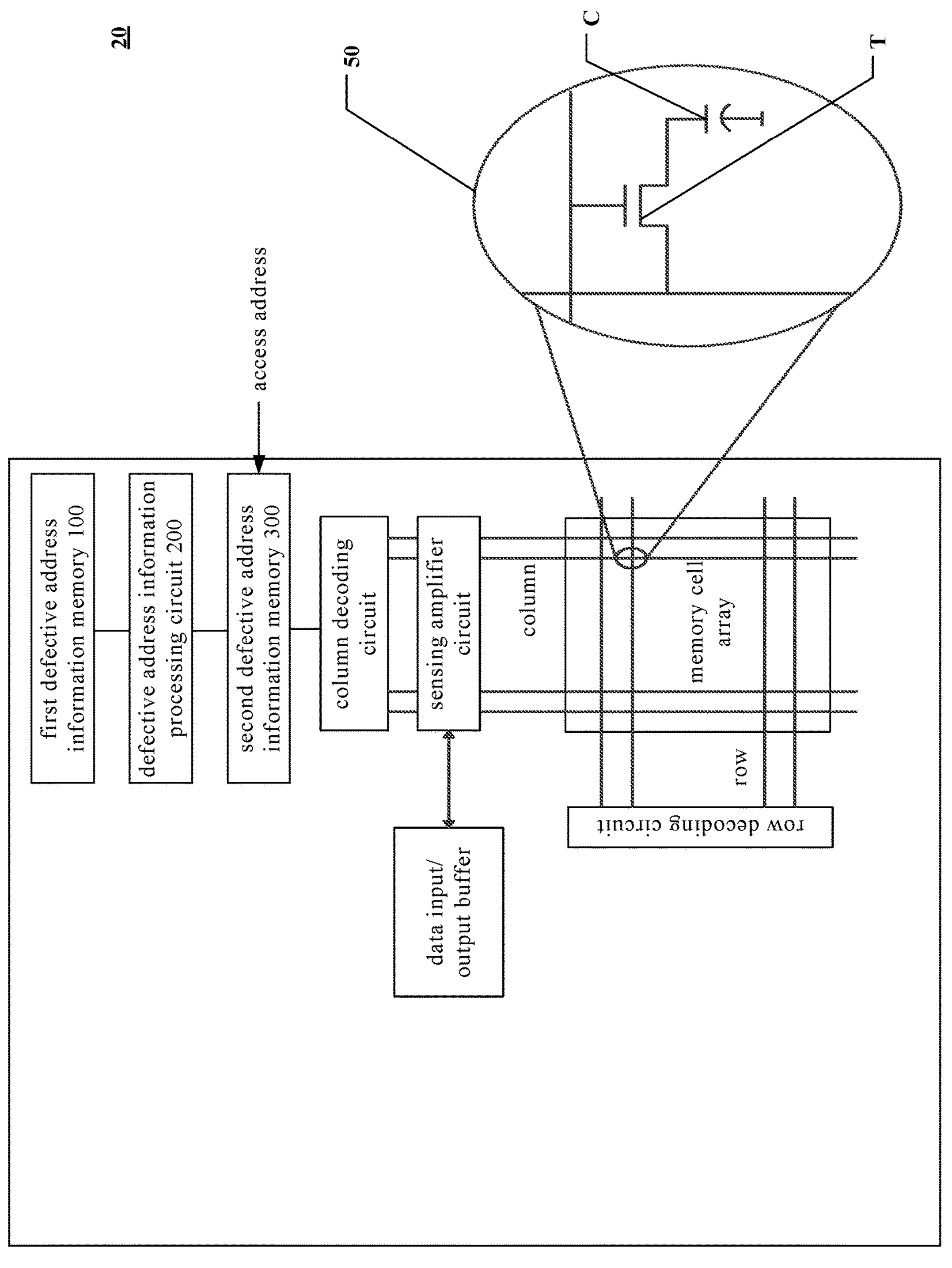

The right side of FIGS. 10A and 10B shows the circuit of a memory cell in a DRAM. DRAM includes at least one DRAM die. Each DRAM die includes a memory cell array. The memory cell array includes a plurality of memory cells 50 arranged in an array. Each memory cell 50 includes a transistor T and a capacitor C. The main working principle of the memory cell is to use the amount of charge stored in the capacitor to represent whether a binary bit is 1 or 0. The memory cells are arranged in an array, which may be regarded as a typical mesh structure. The memory cell array uses a row and a column to specify an address. By specifying the intersection of the row and the column (by specifying the row address and column address of the DRAM), the memory controller may independently access each memory cell in the DRAM die and read, write or refresh the data stored therein.

The left side of FIGS. 10A and 10B shows the memory cell array and partial peripheral circuit in DRAM. It should be noted that, in response to an input address, the row decoding circuit selects a word line to select a row of memory cells to be accessed. The row decoding circuit decodes the input address and enables (activates) the word line corresponding to the decoded address. In response to the input address, the column decoding circuit selects a bit line to select a column of memory cells to be accessed.

The address of the row decoding circuit or the address of the column decoding circuit may be provided by the second defective address information memory 300 provided, according to the implementations of present disclosure after being compared with the access address. In some implementations, as shown in FIG. 10A, the defective address recorded in the second defective address information memory 300 is a defective row address, and the access address is the row address. The second defective address information memory 300 is coupled to the row decoding circuit. In other implementations, as shown in FIG. 10B, the defective address recorded in the second defective address information memory 300 is a defective column address, and the access address is a column address. The second defective address information memory 300 is coupled to the column decoding circuit. Below, taking FIG. 10A as an example for explanation, it should be understood that the present disclosure is not limited thereto. When the access address (row address) is sent from the outside (for example, the host), the defective row address stored in the second defective address information memory 300 may be compared with the access address. If the comparison result is that the access address is the same as the defective row address, the row decoder may output a redundant row address corresponding to the defective row address to realize replacement and repair to ensure that the memory can work normally. If the comparison result is that the access address is different from the defective row address, the access address may be directly used to perform various operations on the memory device.

In some implementations, the defective address information stored in the second defective address information memory 300 is obtained by processing the initial defective address information in the first defective address information memory 100 by the defective address information processing circuit 200. This avoids the problem of repair conflicts caused by one defective address corresponding to two redundant addresses. In some implementations, one defective address corresponds to only one redundant address, thereby improving the accuracy and efficiency of data reading in the memory device.

The implementations of present disclosure further provide a memory device, as shown in FIG. 4. The memory device may include a first defective address information memory 100 including a plurality of first memory areas 101 arranged in sequence.

The memory device may include a defective address information processing circuit 200 including a plurality of comparing sub-circuits 211 and a plurality of identification modifying sub-circuits 221. One comparing sub-circuit 211 is connected to a first memory area other than the first one 101*a* of the first memory areas, and one modifying sub-circuit is connected to one comparing sub-circuit 211 and the first memory area to which the comparing sub-circuit 211 is connected.

The memory device may include a second defective address information memory 300 including a plurality of second memory areas 301 arranged in sequence, each second memory area other than the first one 301*a* of the second memory areas is connected to one modifying sub-circuit, and the first one 101*a* of the first memory areas is connected to the first one of the second memory areas.

In some implementations, the defective address information processing circuit 200 further comprises a buffer 201; and the buffer 201 is connected to the first one 101*a* of the first memory areas, each comparing sub-circuit 211 and the first one 301*a* of the second memory areas.

In some implementations, the comparing sub-circuit 211 comprises an exclusive OR gate.

Figure 11:
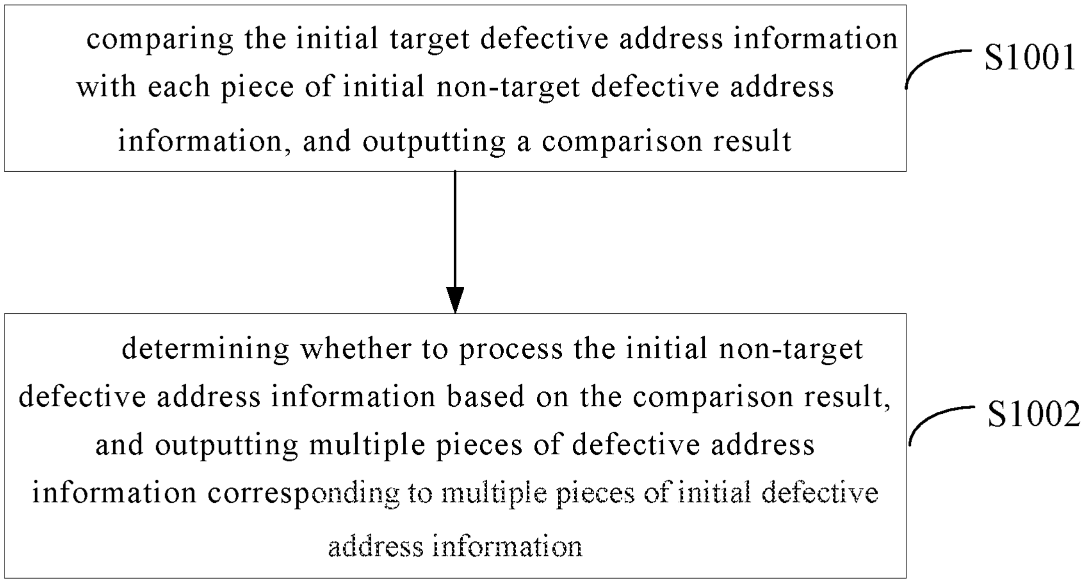
FIGS. 11 to 14 are schematic flow diagrams of an operating method for a memory device provided by the implementations of the present disclosure.

In order to resolve the above problems, as shown in FIG. 11, the implementations of present disclosure further provide a method of operating a memory device.

At operation S1001, the method may include comparing the initial target defective address information with each piece of initial non-target defective address information, and outputting a comparison result.

At operation S1002, the method may include determining whether to process the initial non-target defective address information based on the comparison result, and outputting multiple pieces of defective address information corresponding to multiple pieces of initial defective address information.

In some implementations, each piece of initial defective address information includes at least a first identification information indicating whether the corresponding initial defective address information includes a defective address and a redundant address corresponding to the defective address.

Each piece of defective address information includes a defective address, a second identification information, and a redundant address corresponding to the defective address, wherein the second identification information indicates whether a corresponding relationship between the defective address and the redundant address is valid.

In some implementations, the defective address of the initial target defective address information and the defective address of each piece of the initial non-target defective address information are compared one by one and whether to process the initial non-target defective address information is determined according to the comparison result. The problem of the repair conflict occurs caused by one defective address corresponding to two redundant addresses when the defective address in the initial target defective address information is the same as the defective address in the initial non-target defective address information may be effectively avoided. In some implementations, one defective address only corresponds to one redundant address, thereby improving the accuracy and efficiency of data reading in the memory device.

Figure 12:
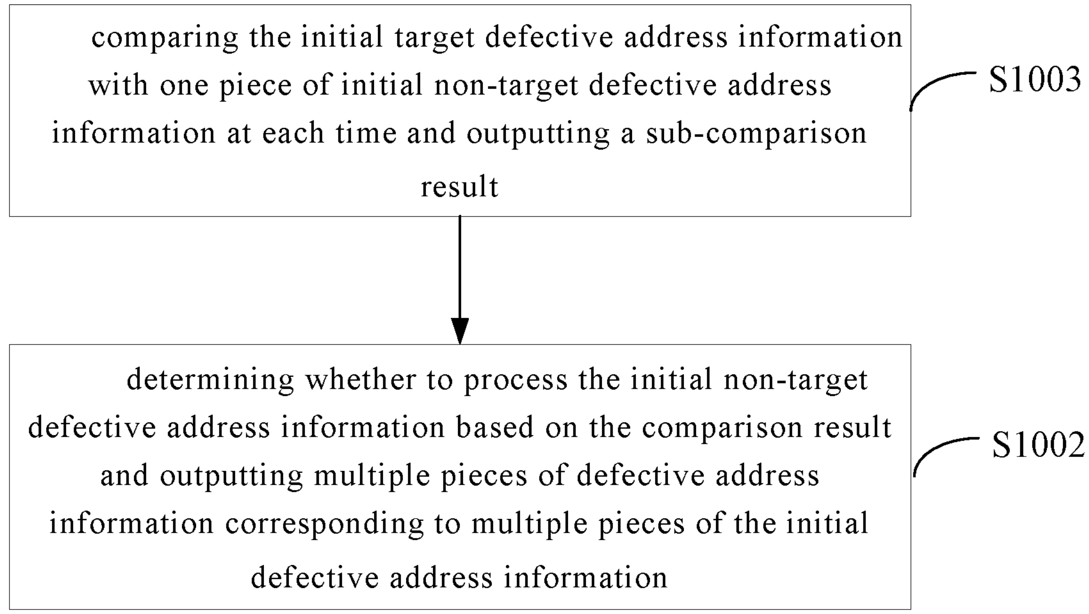

In some implementations, as shown in FIG. 12, at operation S1001, the comparing a defective address in the initial target defective address information with a defective address in the initial non-target defective address information and outputting a comparison result may include comparing (at operation S1003) the initial target defective address information with one piece of initial non-target defective address information at each time and outputting a sub-comparison result.

Figure 13:
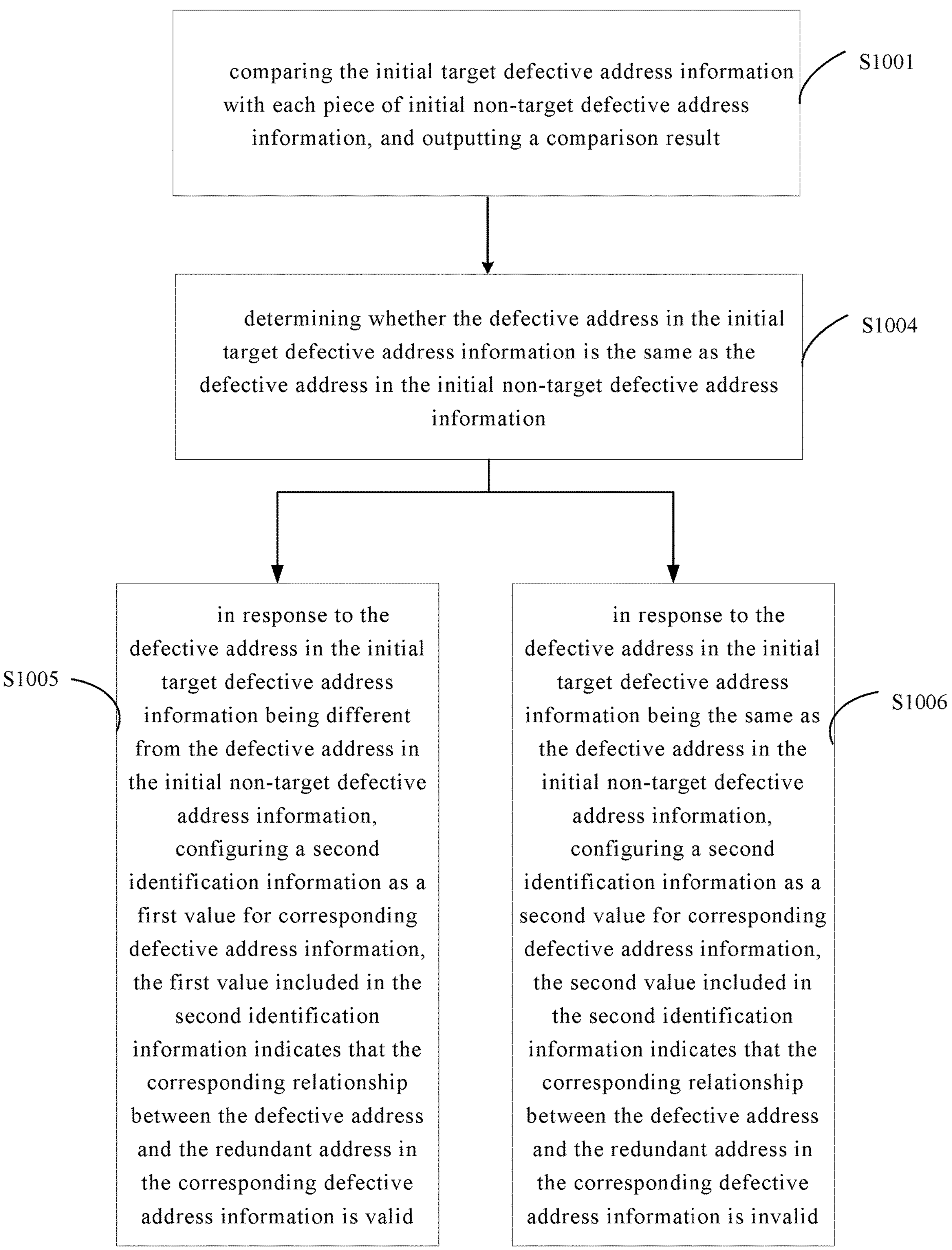

In some implementations, as shown in FIG. 13, in step S1002, the determining whether to process the initial non-target defective address information based on the comparison result and outputting multiple pieces of defective address information corresponding to multiple pieces of the initial defective address information may include determining (at operation S1004) whether the defective address in the initial target defective address information is the same as the defective address in the initial non-target defective address information.

In some implementations, as shown in FIG. 13, in step S1002, the determining whether to process the initial non-target defective address information based on the comparison result and outputting multiple pieces of defective address information corresponding to multiple pieces of the initial defective address information may include, in response to the defective address in the initial target defective address information being different from the defective address in the initial non-target defective address information, configuring (at operation S1005) a second identification information as a first value for corresponding defective address information. The first value included in the second identification information indicates that the corresponding relationship between the defective address and the redundant address in the corresponding defective address information is valid.

In some implementations, as shown in FIG. 13, in step S1002, the determining whether to process the initial non-target defective address information based on the comparison result and outputting multiple pieces of defective address information corresponding to multiple pieces of the initial defective address information may include, in response to the defective address in the initial target defective address information being the same as the defective address in the initial non-target defective address information, configuring (at operation S1006) a second identification information as a second value for corresponding defective address information. The second value included in the second identification information indicates that the corresponding relationship between the defective address and the redundant address in the corresponding defective address information is invalid.

Figure 14:
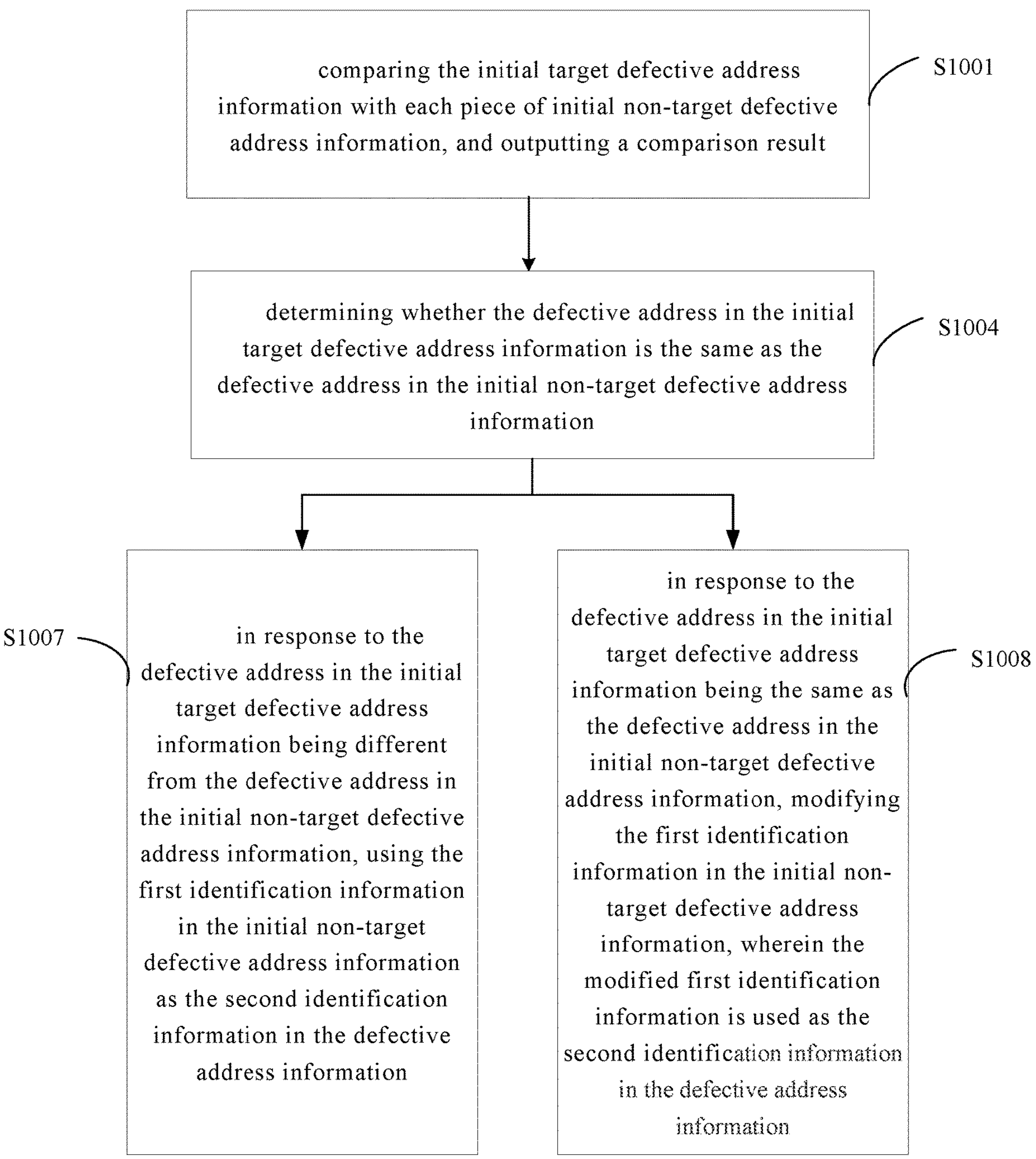

In some implementations, as shown in FIG. 14, at operation S1002, the determining whether to process the initial non-target defective address information based on the comparison result and outputting multiple pieces of defective address information corresponding to multiple pieces of the initial defective address information may include determining (at operation S1004) whether the defective address in the initial target defective address information is the same as the defective address in the initial non-target defective address information;

In some implementations, as shown in FIG. 14, at operation S1002, the determining whether to process the initial non-target defective address information based on the comparison result and outputting multiple pieces of defective address information corresponding to multiple pieces of the initial defective address information may include, in response to the defective address in the initial target defective address information being different from the defective address in the initial non-target defective address information, using (at operation S1007) the first identification information in the initial non-target defective address information as the second identification information in the defective address information.

In some implementations, as shown in FIG. 14, at operation S1002, the determining whether to process the initial non-target defective address information based on the comparison result and outputting multiple pieces of defective address information corresponding to multiple pieces of the initial defective address information may include, in response to the defective address in the initial target defective address information being the same as the defective address in the initial non-target defective address information, modifying (at operation S1008) the first identification information in the initial non-target defective address information, where the modified first identification information is used as the second identification information in the defective address information.

The implementations of present disclosure further provide a computer-readable storage medium, storing a computer program, which when executed, the operating method for the memory device according to any one of above implementations is performed.

The computer readable storage media may include, but are not limited to, random access memory, read-only memory, electrically erasable programmable read only memory (EEPROM), static random access memory, hard disk, and the like.

The computer-readable storage medium further includes one or more of any suitable media for storing executable instructions of a computer program, such that the instruction-executing machine, system, apparatus or device may read (or fetch) instructions from the computer-readable medium and execute instructions for performing the method.

It should be understood that references to “one embodiment” or “an embodiment” throughout the specification means that particular features, structures or characteristics related to the embodiment are included in at least one embodiment of the present disclosure. Thus, the phrases “in one embodiment" or "in an embodiment" appearing throughout the specification do not necessarily refer to the same embodiment. In addition, these particular features, structures or characteristics may be combined arbitrarily and suitably in one or more embodiments. It should be understood that in various embodiments of the present disclosure, the sequence numbers of the above-mentioned processes do not mean that the sequence of execution, and the sequences of execution should be determined by their functions and inherent logic and should not constitute any limitation on the implementation of the embodiments of present disclosure. The above sequence number in embodiments of present disclosure are for description only and do not represent some embodiments are more preferred than others.

It should be noted that the terms "including", "comprising" or any other variation thereof are intended herein to encompass non-exclusive inclusion, such that a process, a method, an article or a device comprising a set of elements includes not only those elements but also other elements not explicitly listed, or also elements inherent to such process, method, article or device. The element defined by the phrase "include a . . . " without further limitation does not preclude the existence of another identical element in the process, method, article or device in which it is included.

The foregoing is only an implementation of present disclosure, but the scope of the present disclosure is not limited thereto. Any variation or replacement readily contemplated by those skilled in the art within the scope of present disclosure should be covered within the scope of the present disclosure. Therefore, the scope of this disclosure shall be subject to the scope of the claims.

What is claimed is:

1. A memory device, comprising:

a first defective address information memory, wherein the first defective address information memory is configured to store multiple pieces of initial defective address information, and the multiple pieces of initial defective address information comprise initial target defective address information and multiple pieces of initial non-target defective address information, the initial target defective address information being stored in the first defective address information memory after the multiple pieces of initial non-target defective address information;

a defective address information processing circuit, wherein the defective address information processing circuit is connected to the first defective address information memory, and is configured to:

compare the initial target defective address information previously stored in the first defective address information memory with each of the multiple pieces of initial non-target defective address information previously stored in the first defective address information memory;

control whether to process the initial non-target defective address information based on a comparison result, wherein respective comparing sub-circuits of the defective address information processing circuit are configured to operate in parallel to output respective sub-comparison results, and the comparison result is generated based on the respective sub-comparison results;

in response to one of the sub-comparison results indicating a match between the initial target defective address information and a respective one of the multiple pieces of initial non-target defective address information, generating corresponding defective address information comprising second identification information that comprises a second value, the second value indicating that a corresponding relationship between a defective address and a redundant address in the corresponding defective address information is invalid, and the corresponding defective address information is prohibited to be used; and output multiple pieces of defective address information corresponding to the multiple pieces of initial defective address information; and a second defective address information memory, wherein the second defective address information memory is connected to the defective address information processing circuit, and is configured to store the multiple pieces of defective address information.

2. The memory device of claim 1, wherein:

each of the multiple pieces of initial defective address information comprises first identification information, the first identification information indicates whether corresponding initial defective address information comprises a defective address and a redundant address corresponding to the defective address, and each of the multiple pieces of defective address information comprises a defective address, the second identification information, and a redundant address corresponding to the defective address.

3. The memory device of claim 2, wherein the defective address information processing circuit is further configured to:

determine whether the defective address in the initial target defective address information is the same as the defective address in the initial non-target defective address information;

in response to the defective address in the initial target defective address information being different from the defective address in the initial non-target defective address information, configure the second identification information as a first value for the corresponding defective address information, the first value included in the second identification information indicating that the corresponding relationship between the defective address and the redundant address in the corresponding defective address information is valid; and in response to the defective address in the initial target defective address information being the same as the defective address in the initial non-target defective address information, configure the second identification information as the second value for the corresponding defective address information.

4. The memory device of claim 2, wherein the defective address information processing circuit is configured to:

determine whether the defective address in the initial target defective address information is the same as the defective address in the initial non-target defective address information;

in response to the defective address in the initial target defective address information being different from the defective address in the initial non-target defective address information, configure the second identification information in the defective address information to have a first value corresponding to the first identification information in the initial non-target defective address information; and in response to the defective address in the initial target defective address information being the same as the defective address in the initial non-target defective address information, modify the first identification information in the initial non-target defective address information to generate the second identification information having the second value for the defective address information.

5. The memory device of claim 2, wherein:

the defective address information processing circuit comprises a comparing circuit and an identification modifying circuit, the comparing circuit is connected to the first defective address information memory and is configured to compare the defective address in the initial target defective address information with the defective address in the initial non-target defective address information, and output the comparison result, and the identification modifying circuit is connected to the comparing circuit and is configured to configure the second identification information for the corresponding defective address information based on the comparison result.

6. The memory device of claim 5, wherein:

the comparing circuit comprises a plurality of comparing sub-circuits, each of the comparing sub-circuits is connected to the first defective address information memory and is configured to compare the initial target defective address information and one piece of multiple pieces of initial non-target defective address information and output a sub-comparison result of the sub-comparison results; and the identification modifying circuit comprises a plurality of identification modifying sub-circuits, each of the identification modifying sub-circuits is connected to one of the plurality of comparing sub-circuits and the first defective address information memory, and is configured to configure the second identification information for the corresponding defective address information based on the sub-comparison result.

7. The memory device of claim 6, wherein the comparing sub-circuit comprises an exclusive OR gate.

8. The memory device of claim 6, wherein:

the defective address information processing circuit further comprises a buffer, and the buffer is connected to the first defective address information memory, each of the comparing sub-circuits, and the second defective address information memory, and is configured to store the initial target defective address information.

9. The memory device of claim 8, wherein:

the first defective address information memory comprises a plurality of first memory areas arranged in sequence, a first one of the first memory areas is connected to the buffer and is configured to store the initial target defective address information, each first memory area, other than the first one of the first memory areas, is connected to one of the comparing sub-circuits, and each first memory area, other than the first one of the first memory areas, is configured to store the initial non-target defective address information, the second defective address information memory comprises a plurality of second memory areas arranged in sequence, a first one of the second memory areas is connected to the buffer and is configured to store the initial target defective address information, and each second memory area, other than the first one of the second memory areas, is connected to one of the identification modifying sub-circuits.

10. The memory device of claim 9, wherein:

the second defective address information memory is further connected to the first defective address information memory, the memory device further comprises a determining circuit connected to the first defective address information memory and the defective address information processing circuit, and the determining circuit is configured to:

determine whether a defective address and a redundant address corresponding to the defective address are stored in the first one of the first memory areas according to the first identification information in the first one of the first memory areas, and output a determination result;

in response to the determination result indicating that the defective address and the redundant address corresponding to the defective address are not stored in the first one of the first memory areas, prohibit the defective address information processing circuit from modifying the initial non-target defective address information, the initial non-target defective address information being directly output to the second defective address information memory as defective address information; and in response to the determination result indicating that the defective address and the redundant address corresponding to the defective address are stored in the first one of the first memory areas, enable the defective address information processing circuit to modify the initial non-target defective address information.

11. The memory device of claim 1, wherein a redundant address in the initial target defective address information comprises a post-encapsulation repair redundant address, and a redundant address in the initial non-target defective address information comprises a pre-encapsulation repair redundant address.

12. The memory device of claim 1, wherein the memory device comprises a three-dimensional dynamic random access memory device.

13. A method of operating a memory device, wherein the memory device comprises:

a first defective address information memory configured to store multiple pieces of initial defective address information, and the multiple pieces of initial defective address information comprise initial target defective address information and multiple pieces of initial non-target defective address information, the initial target defective address information being stored in the first defective address information memory after the multiple pieces of initial non-target defective address information; and a defective address information processing circuit coupled to the first defective address information memory;

the method comprising:

comparing, through the defective address information processing circuit, the initial target defective address information with each piece of the multiple pieces of initial non-target defective address information;

generating, through respective comparing sub-circuits of the defective address information processing circuit configured to operate in parallel, respective sub-comparison results, and controlling whether to process the initial non-target defective address information based on a comparison result, the comparison result comprising the respective sub-comparison results;

in response to one of the sub-comparison results indicating a match between the initial target defective address information and a respective one of the initial non-target defective address information, generating corresponding defective address information comprising second identification information that comprises a second value, the second value indicating that a corresponding relationship between a defective address and a redundant address in the corresponding defective address information is invalid, and the corresponding defective address information is prohibited to be used; and outputting, through the defective address information processing circuit, multiple pieces of defective address information corresponding to the multiple pieces of initial defective address information, and storing, in a second defective address information memory coupled to the defective address information processing circuit, the multiple pieces of defective address information.

14. The method of claim 13, wherein:

each of the multiple pieces of initial defective address information comprises first identification information, the first identification information indicates whether a corresponding initial defective address information comprises a defective address and a redundant address corresponding to the defective address, and each of the multiple pieces of defective address information comprises a defective address, the second identification information, and a redundant address corresponding to the defective address.

15. The method of claim 14, further comprising:

comparing the defective address in the initial target defective address information with the defective address in the initial non-target defective address information and outputting the comparison result, comprising:

comparing the initial target defective address information with one piece of the multiple pieces of initial non-target defective address information at each time and outputting the corresponding sub-comparison result.

16. The method of claim 14, wherein determining whether to process the initial non-target defective address information based on the comparison result and outputting the multiple pieces of defective address information corresponding to the multiple pieces of initial defective address information comprises:

determining whether the defective address in the initial target defective address information is the same as the defective address in the initial non-target defective address information;

in response to the defective address in the initial target defective address information being different from the defective address in the initial non-target defective address information, configuring the second identification information as a first value for the corresponding defective address information, the first value included in the second identification information indicates that the corresponding relationship between the defective address and the redundant address in the corresponding defective address information is valid; and in response to the defective address in the initial target defective address information being the same as the defective address in the initial non-target defective address information, configuring the second identification information as the second value for the corresponding defective address information.

17. The method of claim 13, wherein the memory device comprises a three-dimensional dynamic random access memory device.

18. The memory device of claim 1, wherein:

the second defective address information memory is configured to store the multiple pieces of defective address information comprising at least two pieces of defective address information having a same defective address; and the second identification information of the at least two pieces of defective address information corresponds to different values, one of the at least two pieces of defective address information being enabled for use, and another of the at least two pieces of defective address information being prohibited from being used.

19. The memory device of claim 1, wherein:

the defective address information processing circuit further comprises a determining circuit configured to enable or disable the comparing sub-circuits based on first identification information of the initial target defective address information.

20. The memory device of claim 1, wherein:

the first defective address information memory comprises a first memory area, and a buffer circuit is configured to buffer the defective address information, corresponding to the initial target defective address information, from the first memory area and store the defective address information in the second defective address information memory.

* * * * *